United States Patent [19]

Imai

[11] Patent Number: 5,742,067
[45] Date of Patent: Apr. 21, 1998

[54] EXPOSURE METHOD AND APPARATUS THEREFOR

[75] Inventor: Yuji Imai, Omiya, Japan

[73] Assignee: Nikon Corporation, Tokyo, Japan

[21] Appl. No.: 563,096

[22] Filed: Nov. 27, 1995

[30] Foreign Application Priority Data

Nov. 29, 1994 [JP] Japan ................... 6-294270
Nov. 16, 1995 [JP] Japan ................... 7-322131

[51] Int. Cl.$^6$ ............................. G01N 21/86
[52] U.S. Cl. ........................ 250/548; 356/401
[58] Field of Search ............... 250/548; 356/400, 356/401, 399

[56] References Cited

U.S. PATENT DOCUMENTS

| 4,558,949 | 12/1985 | Uehara et al. | 356/152 |
| 4,780,617 | 10/1988 | Umatate et al. | 250/548 |
| 5,015,866 | 5/1991 | Hayashi | 250/548 |
| 5,448,332 | 9/1995 | Sakakibara et al. | 355/53 |
| 5,461,237 | 10/1995 | Wakamoto et al. | 250/548 |

FOREIGN PATENT DOCUMENTS

A-5-190423  7/1993  Japan .

*Primary Examiner*—Edward P. Westin
*Assistant Examiner*—Kevin Pyo
*Attorney, Agent, or Firm*—Oliff & Berridge, PLC

[57] ABSTRACT

A projection exposure method is provided for transferring a pattern formed on a mask through a projection optical system onto a plurality of shot areas on a photosensitive substrate respectively. Correction for inclination of the entire photosensitive substrate (global leveling) is performed during movement of the substrate for positioning for a first exposure shot (step 110). Leveling at each exposure position (chip leveling) is performed after positioning for each exposure shot (step 112), and then exposure is performed. Therefore, the leveling operation is divided, the correction amount for leveling at each exposure position is small, and the leveling is completed in a short period of time at the exposure position. Positional adjustment for the substrate in a direction of an optical axis is performed during movement of the substrate to a shot to be subsequently exposed. The leveling and the focusing can be accurately performed at each exposure shot position without extremely lowering the throughput. The method is also is applicable to exposure methods of the step-and-repeat system and the slit scan system.

17 Claims, 7 Drawing Sheets

EXPOSURE METHOD AND APPARATUS THEREFOR

FIELD OF THE INVENTION

The present invention relates to a projection exposure method and an apparatus therefor used to form a circuit pattern on a substrate for semiconductor integrated circuits and liquid crystal boards by means of the photolithography technique. In particular, the present invention relates to an exposure method and an apparatus therefor of the step-and-repeat system and those of the slit scan system in which a mask pattern is successively transferred onto a plurality of shot areas on a photosensitive substrate through a projection optical system.

DESCRIPTION OF THE RELATED ART

A projection lens system having a large numerical aperture (N.A.) is used for exposure apparatuses of the step-and-repeat system, especially for wafer steppers which are reduction projection type exposure apparatuses for producing semiconductor devices. Therefore, in such an apparatus, the depth of focus is extremely small. For this reason, it is impossible to perform exposure in such a way that a distinct pattern is obtained over an entire exposure area, unless a leveling operation, in which an exposure area on a wafer is paralleled to an image plane of a projection lens system, is executed concurrently with a focusing operation so that a surface of the exposure area is within a depth of focus of the projection lens system over its entire surface.

As for the entire wafer, the wafer surface can be set approximately in parallel to the image plane of the projection lens system by the detection of three or more points on the wafer surface by using a separately provided autofocus mechanism (for example, a multiple-point AF system of the so-called oblique incidence illumination system as disclosed in Japanese Patent Laid-open No. 5-190423 (U.S. patent application Ser. No. 003451 filed on Jan. 12, 1993)). So-called global leveling has been hitherto performed in this manner, in which the wafer is inclined only once before exposure.

However, in the case of large-sized wafers or new materials such as gallium arsenide as a substitute for silicon, the flatness of the wafer itself is unstable. Accordingly, it becomes necessary to partially detect vertical positions on the wafer. In addition, the deformation of the wafer is intensified by exposure and chemical treatments in each of processing cycles. Thus it becomes indispensable to perform correct horizontality detection for the exposure area. An apparatus for detecting vertical positions partially (for each of shot areas) on the wafer as described above is disclosed in U.S. Pat. No. 4,558,949. This apparatus includes "an illumination optical system for supplying a parallel luminous flux emitted from a minute aperture to an area in a predetermined conjugate relation relative to a main objective lens obliquely with respect to an optical axis of the objective lens, and a light-collecting optical system for collecting the luminous flux supplied from the illumination optical system and reflected by the conjugate area onto a photoelectric element, optical axes of the both optical systems being arranged in symmetry relative to the main objective lens", in order to distinguish whether or not the conjugate area relative to the main objective lens is perpendicular to the optical axis of the main objective lens by using an output from the light-receiving element. Some machines have adopted this type of apparatus for detecting positions for horizontality as disclosed in U.S. Pat. No. 4,558,949 to perform so-called chip leveling in which a wafer is inclined with respect to an image plane of a projection lens system for each shot area.

However, the machines, which adopt only the global leveling as described above, have had an inconvenience that the inclination of each chip cannot be corrected although the inclination of an entire substrate can be corrected. On the other hand, the machines, which adopt the chip leveling as described above, can correct the inclination of each chip (for each shot area). However, they have had an inconvenience that the throughput decreases because leveling and focusing operations are performed respectively every time when the positioning at each shot area is completed.

Recently, an exposure apparatus of the slit scan system (scanning type exposure apparatus) has been developed, in which a photosensitive substrate is successively exposed with a pattern on a reticle by illuminating a part of a pattern area on the reticle in a form of slit or circular arc, scanning the reticle with respect to an illuminated area, and scanning the photosensitive substrate in synchronization with the scanning for the reticle with respect to an area (exposure area) which is conjugate with the illuminated area relative to a projection optical system. The exposure apparatus of this system has an advantage that a projected image is prevented from distortion, and the illuminance can be easily uniformalized because the illumination area on a reticle is small as compared with the exposure apparatus of the step-and-repeat system and only a part of an image field of the projection optical system is used for exposure. It is also demanded in such an exposure apparatus of the slit scan system that the focusing and the leveling adjustment for each chip is executed without decreasing the throughput.

SUMMARY OF THE INVENTION

An object of the present invention is to provide an exposure method and an apparatus therefor which make it possible to perform leveling and focusing operations with high accuracy at an exposure position without extremely decreasing the throughput.

According to a first aspect of the present invention, there is provided an exposure method of the step-and-repeat system for successively transferring a mask pattern formed on a mask through a projection optical system onto a plurality of shot areas on a photosensitive substrate respectively, comprising a first step of measuring positions in a direction of an optical axis of the projection optical system at a plurality of position-measuring points on the photosensitive substrate respectively; a second step of correcting relative inclination between an image plane of the projection optical system and a surface of the photosensitive substrate on the basis of a result of the measurement in the first step during movement of the photosensitive substrate for positioning one shot area of the plurality of shot areas into an image field of the projection optical system; a third step of detecting an inclination amount and a focal discrepancy amount of a surface of the one shot area with respect to the image plane of the projection optical system, and inclining the photosensitive substrate and moving it in the direction of the optical axis on the basis of a result of the detection; a fourth step of transferring the mask pattern onto the one shot area, and determining a positional discrepancy amount from the image plane of the projection optical system for a surface of another shot area which is different from the one shot area and onto which the mask pattern is subsequently transferred on the basis of an inclination amount of the photosensitive substrate inclined in the third step; and a fifth step of moving the photosensitive substrate in the direction of the optical axis in an amount corresponding to the determined positional discrepancy amount in the forth step during movement of the photosensitive substrate for positioning the another shot area into the image field of the projection optical system.

According to the present invention, the correction for inclination of the entire photosensitive substrate (global leveling) is performed in the second step during the movement of the photosensitive substrate for positioning one of the plurality of shot areas within the image field (projection field) of the projection optical system, and the leveling at each exposure position (chip leveling) is performed in the third step after the positioning of each of the shot areas at the exposure position (projection position for the mask pattern through the projection optical system). Therefore, the leveling operation is divided, the amount of leveling correction at each exposure position is small, and the leveling is completed in a short period of time at the exposure position. In the fifth step, the photosensitive substrate is moved toward the image plane along the direction of the optical axis during the movement to the next shot area (area different from the one area) in the amount corresponding to the positional discrepancy amount from the image plane of the projection optical system determined in the fourth step. Thus coarse focusing has been achieved when each shot area is positioned. Therefore, the focusing operation and the movement of the photosensitive substrate are divided, the amount of movement of the photosensitive substrate in the direction of the optical axis is small at each exposure position, and the focusing is completed in a short period of time at the exposure position. Namely, a part of the focusing operation is performed concurrently with the movement for positioning the photosensitive substrate at the exposure position.

According to a second aspect of the present invention, there is provided an exposure method of the step-and-repeat system for successively transferring a pattern formed on a mask through a projection optical system onto a plurality of shot areas on a photosensitive substrate respectively, comprising:

a first step of measuring positions in a direction of an optical axis of the projection optical system at position-measuring points on all shot areas onto which the pattern on the mask is transferable;

a second step of calculating inclination amounts of the all shot areas on the basis of a result of the measurement in the first step;

a third step of determining an inclination amount and a focal discrepancy amount of a surface of one shot area to be firstly exposed with respect to an image plane of the projection optical system in accordance with the first and second steps, and inclining the photosensitive substrate and moving it in the direction of the optical axis on the basis of the determined inclination amount and the determined focal discrepancy amount;

a fourth step of transferring the mask pattern onto the one shot area;

a fifth step of determining a positional discrepancy amount in the direction of the optical axis and a remaining inclination amount of another shot area which undergoes transfer next to the one shot area on the basis of a position in the direction of the optical axis measured in the first step and an inclination amount calculated in the second step of the another shot area and a position in the direction of the optical axis and an inclination amount of the one shot area undergone transfer; and a sixth step of inclining the photosensitive substrate and moving it in the direction of the optical axis on the basis of the positional discrepancy amount in the direction of the optical axis and the remaining inclination amount of the another shot area determined in the fifth step during movement of the photosensitive substrate for positioning the another shot area into an image field of the projection optical system.

According to a third aspect of the present invention, there is provided a scanning type exposure method for successively exposing a plurality of shot areas on a photosensitive substrate with a pattern on a mask through a projection optical system by scanning the mask with respect to an illumination area on the mask while illuminating the mask, and scanning the photosensitive substrate in synchronization with the scanning for the mask with respect to an exposure area conjugate with the illumination area relative to the projection optical system, comprising:

a first step of measuring positions in a direction of an optical axis of the projection optical system at a plurality of position-measuring points on the photosensitive substrate respectively;

a second step of correcting relative inclination between an image plane of the projection optical system and a surface of the photosensitive substrate on the basis of a result of the measurement in the first step during movement of the photosensitive substrate for positioning one shot area of the plurality of shot areas at an exposure start position;

a third step of detecting an inclination amount and a focal discrepancy amount of a surface of the one shot area with respect to the image plane of the projection optical system, and inclining the photosensitive substrate and moving it in the direction of the optical axis on the basis of a result of the detection so that the surface of the one shot area in the exposure area is parallel to the image plane of the projection optical system and coincides with a focal position of the projection optical system, while performing scanning exposure for the one shot area on the photosensitive substrate and the mask in synchronization;

a fourth step of determining a positional discrepancy amount from the image plane of the projection optical system for a surface of another shot area which is different from the one shot area and onto which the mask pattern is subsequently transferred on the basis of an inclination amount of the photosensitive substrate upon completion of the scanning exposure for the one shot area; and a fifth step of moving the photosensitive substrate in the direction of the optical axis in an amount corresponding to the determined positional discrepancy amount in the forth step during movement of the photosensitive substrate for positioning the another shot area at the exposure start position.

According to the invention of the third aspect described above, the correction for inclination of the entire photosensitive substrate (global leveling) is performed in the second step during the movement of the photosensitive substrate for positioning one of the plurality of shot areas within an image field (projection field) of the projection optical system, and the leveling at each exposure position (chip leveling) is performed in the third step while performing the scanning exposure for the one shot area on the photosensitive substrate and the mask in synchronization. Therefore, the leveling operation is divided, the amount of leveling correction at each exposure position is small, and the leveling is completed in a short period of time at the exposure position. In the fifth step, the photosensitive substrate is moved toward the image plane along the direction of the optical axis during the movement to the next shot area (area different from the one area) in the amount corresponding to the positional discrepancy amount from the image plane of the projection optical system determined in the fourth step. Thus coarse focusing has been achieved when each shot area is positioned. Therefore, the focusing operation and the movement of the photosensitive substrate are divided, the amount of movement of the photosensitive substrate in the direction of the optical axis is small at each exposure position, and the focusing is completed in a short period of time at the exposure start position. Namely, a part of the focusing operation is performed concurrently with the movement for positioning the photosensitive substrate at the exposure position.

In the invention of the third aspect described above, a positional variation amount in the direction of the optical axis of the image plane of the projection optical system due to positional variation of the mask in the direction of the optical axis generated during the scanning for the mask is preferably incorporated into an amount of the movement for moving the photosensitive substrate in the direction of the optical axis on the basis of the result of the detection in the third step described above, and it is preferably incorporated into the positional discrepancy amount from the image plane of the projection optical system in the fourth step described above.

According to a fourth aspect of the present invention, there is provided a step-and-repeat type exposure apparatus for successively transferring an image of pattern formed on a mask onto a plurality of shot areas on a photosensitive substrate respectively, comprising a projection optical system for projecting the image of the pattern formed on the mask onto the photosensitive substrate; the movable member for holding the photosensitive substrate, the movable member being movable in a direction of an optical axis of the projection optical system, and inclinable with respect to an image plane of the projection optical system; a substrate stage for bearing the movable member, the substrate stage being movable two-dimensionally in a plane perpendicular to the optical axis of the projection optical system; a first detecting means for optically detecting positions on a surface of the photosensitive substrate in the direction of the optical axis of the projection optical system; a second detecting means for optically detecting inclination of surfaces of shot areas on the photosensitive substrate with respect to the image plane of the projection optical system; a first leveling means for inclining the movable member on the basis of a plurality of positions which are measured in the direction of the optical axis at the plurality of position-measuring points on the photosensitive substrate respectively by using the first detecting means, in order to correct relative inclination between the image plane of the projection optical system and the surface of the photosensitive substrate; a first control means for controlling the substrate stage for its movement position while monitoring the movement position of the substrate stage so that a plurality of shot areas on the photosensitive substrate are successively exposed with the pattern image of the mask; a focusing means for driving the movable member on the basis of an output of the first detecting means so that a surface of one shot area on the photosensitive substrate having been corrected for inclination coincides with a focal position of the projection optical system; a second leveling means for driving the movable member on the basis of an output of the second detecting means so that the surface of the one shot area is parallel to the image plane of the projection optical system; and a second control means for determining a positional discrepancy amount from the image plane of the projection optical system for a surface of another shot area which is different from the one shot area and onto which the mask pattern is subsequently transferred on the basis of inclination amounts of the surfaces of the shot areas on the photosensitive substrate driven by the second leveling means, and controlling movement of the movable member so that the photosensitive substrate is moved in the direction of the optical axis in an amount corresponding to the positional discrepancy amount during movement of the substrate stage for positioning the another shot area at an exposure position by the first control means.

In this invention, the leveling may be performed for a shot area located in the vicinity of a center of a photosensitive substrate by using only positional information on the same shot area and shot areas adjacent thereto, or by using only positional information on shot areas adjacent to the same shot area. However, the leveling is desirably performed for a shot area located in the vicinity of a periphery of a photosensitive substrate by using positional information on both of the same shot area and shot areas adjacent thereto, because the number of shot areas adjacent thereto is small. In any case, the leveling for a shot area is desirably performed by using at least three pieces of positional information.

In the present photolithography processing steps for producing semiconductor devices, in order to suppress the production cost and improve the productivity, two types of apparatuses are used in combination. They are an exposure apparatus for so-called critical layers for transferring fine patterns at a high resolution onto shot areas on a photosensitive substrate, and an exposure apparatus for so-called non-critical layers for transferring relatively coarse patterns at a high throughput onto shot areas on a photosensitive substrate. The exposure apparatus for critical layers contains a projection optical system in which the resolving power is high although the field size is not large, which has, for example, a field size of 22 mm square, and a practical resolving power of 0.35 µm taking the depth of focus into consideration. On the other hand, the exposure apparatus for non-critical layers contains a projection optical system in which the field is wide although the resolving power is not high, which has, for example, a field size of 44 mm square, and a resolving power of 0.8 µm. All of these numerical values are values on a photosensitive substrate, and they are merely illustrative examples in every sense. Therefore, the exposure apparatus for non-critical layers can expose, with a coarse pattern at once, a plurality (for example, about four) of shot areas on a photosensitive substrate on which a fine pattern has been formed by the exposure apparatus for critical layers, since it contains the projection optical system having a wide field. In other words, the exposure apparatus for non-critical layers handles a small number of shot areas on one photosensitive substrate. For example, the number is about a fraction (for example, ¼) of a number of shot areas on a photosensitive substrate handled by the exposure apparatus for critical layers. For this reason, in the case of the exposure apparatus for non-critical layers, even when the position in the direction of the optical axis is measured for all shot areas on a photosensitive substrate, the influence on the throughput exerted by the increase in exposure time accompanied therewith is relatively small.

According to the exposure apparatus of the present invention, the first leveling means uses the first detecting means to measure the positions in the direction of the optical axis at the plurality of position-measuring points on the photosensitive substrate respectively, and the movable member is inclined on the basis of the plurality of measured positions. Thus the relative inclination between the image plane of the projection optical system and the surface of the photosensitive substrate is corrected. So-called global leveling is thereby performed for the photosensitive substrate. In this procedure, it is desirable that the first detecting means measures the position in the direction of the optical axis for surfaces of a plurality of shot areas located on a peripheral portion of the photosensitive substrate. The first control means controls the movement position of the substrate stage while monitoring the movement position of the substrate stage so that a plurality of shot areas on the photosensitive substrate are successively exposed with the pattern image of the mask. When each of the shot areas is positioned by the first control means, the focusing means drives the movable member on the basis of an output of the first detecting means so that a surface of one shot area on the photosensitive substrate having been corrected for inclination coincides with a focal position of the projection optical system. Concurrently, the second leveling means drives the movable member on the basis of an output of the second detecting means so that the surface of the one shot area is parallel to the image plane of the projection optical system. Thus focusing on the shot area position on the photosensitive substrate is performed, and so-called chip leveling is performed. After that, exposure is started. The projection optical system projects the pattern formed on the mask onto the one shot area on the photosensitive substrate to perform exposure.

During the exposure, the second control means determines (estimates) a positional discrepancy amount from the image plane of the projection optical system for a surface of another shot area which is different from the one shot area and onto which the mask pattern is subsequently transferred on the basis of inclination amounts of the surfaces of the shot areas on the photosensitive substrate driven by the second leveling means, and after completion of the exposure, it controls movement of the movable member so that the photosensitive substrate is moved in the direction of the optical axis in an amount corresponding to the positional discrepancy amount during movement of the substrate stage by the first control means for positioning the other shot area at the exposure position. Thus coarse focusing is performed during a period until the positioning for the next shot area at the exposure position is completed.

According to a fifth aspect of the present invention, there is provided a scanning type exposure apparatus for successively exposing a plurality of shot areas on a photosensitive substrate, comprising a mask stage for scanning a mask with respect to an illumination area on the mask, a projection optical system for projecting an image of a pattern on the mask onto the photosensitive substrate, and a substrate stage capable of two-dimensional movement for scanning the photosensitive substrate in synchronization with the scanning for the mask with respect to an exposure area which is conjugate with the illumination area relative to the projection optical system, the apparatus further comprising:

a movable member installed on the substrate stage capable of two-dimensional movement, the movable member being movable in a direction of an optical axis of the projection optical system while holding the photosensitive substrate, and inclinable with respect to an image plane of the projection optical system;

a detecting means for optically detecting positions on a surface of the photosensitive substrate in the direction of the optical axis of the projection optical system, and inclination with respect to the image plane of the projection optical system;

a first leveling means for inclining a movable member on the basis of a plurality of measured positions which are measured positions in the direction of the optical axis at the plurality of position-measuring points on the photosensitive substrate respectively by using the detecting means, in order to correct relative inclination between the image plane of the projection optical system and the surface of the photosensitive substrate;

a first control means for controlling the substrate stage for its movement position while monitoring the movement position of the substrate stage so that a plurality of shot areas on the photosensitive substrate are successively exposed with the pattern image of the mask;

a second leveling means for driving the movable member on the basis of an output of the detecting means so that a surface of one shot area existing in the exposure area coincides with a focal position of the projection optical system and is parallel to the image plane of the projection optical system during a period of the scanning for the one shot area on the photosensitive substrate and the mask in synchronization; and a second control means for determining a positional discrepancy amount from the image plane of the projection optical system for a surface of another shot area which is different from the one shot area and onto which the mask pattern is subsequently transferred on the basis of inclination amounts, upon completion of the scanning exposure, of the surfaces of the shot areas on the photosensitive substrate driven by the second leveling means, and controlling movement of the movable member so that the photosensitive substrate is moved in the direction of the optical axis in an amount corresponding to the positional discrepancy amount during movement of the substrate stage for positioning the another shot area at an exposure start position by the first control means.

According to the scanning type exposure apparatus of the present invention, the first leveling means uses the detecting means to measure the positions in the direction of the optical axis at the plurality of position-measuring points on the photosensitive substrate respectively, and the movable member is inclined on the basis of the plurality of measured positions. Thus the relative inclination between the image plane of the projection optical system and the surface of the photosensitive substrate is corrected. So-called global leveling is thereby performed for the photosensitive substrate. In this procedure, it is desirable that the detecting means measures the position in the direction of the optical axis for surfaces of a plurality of shot areas located on a peripheral portion of the photosensitive substrate. The first control means controls the movement position of the substrate stage while monitoring the movement position of the substrate stage so that a plurality of shot areas on the photosensitive substrate are successively exposed with the pattern image of the mask. When each of the shot areas is positioned by the first control means at an exposure start position, the substrate stage and the mask stage starts movement in synchronization, and the scanning exposure is performed. During a period in which the scanning exposure is performed, the second leveling means drives the movable member on the basis of an output of the detecting means so that a surface of one shot area subjected to the exposure, especially an exposure area, coincides with a focal position of the projection optical system, and it is parallel to the image plane of the projection optical system. Thus focusing on the exposure area on the photosensitive substrate is performed, and so-called chip leveling is performed.

The second control means determines (estimates) a positional discrepancy amount from the image plane of the projection optical system for a surface of another shot area which is different from the one shot area and onto which the mask pattern is subsequently transferred on the basis of inclination amounts of the surfaces of the shot areas on the photosensitive substrate driven by the second leveling means upon completion of the scanning exposure, and after completion of the exposure, it controls movement of the movable member so that the photosensitive substrate is moved in the direction of the optical axis in an amount corresponding to the positional discrepancy amount during movement of the substrate stage by the first control means for positioning the other shot area at the exposure position. Thus coarse focusing is performed during a period until the positioning for the next shot area at the exposure start position is completed.

DETAILED DESCRIPTION OF THE PREFERRED EMBODIMENTS

Embodiments of the present invention will be explained below with reference to the drawings, however, the present invention is not limited thereto.
Embodiment 1

Embodiment 1 of the present invention will be explained with reference to FIGS. 1 and 2.

Figure 1:
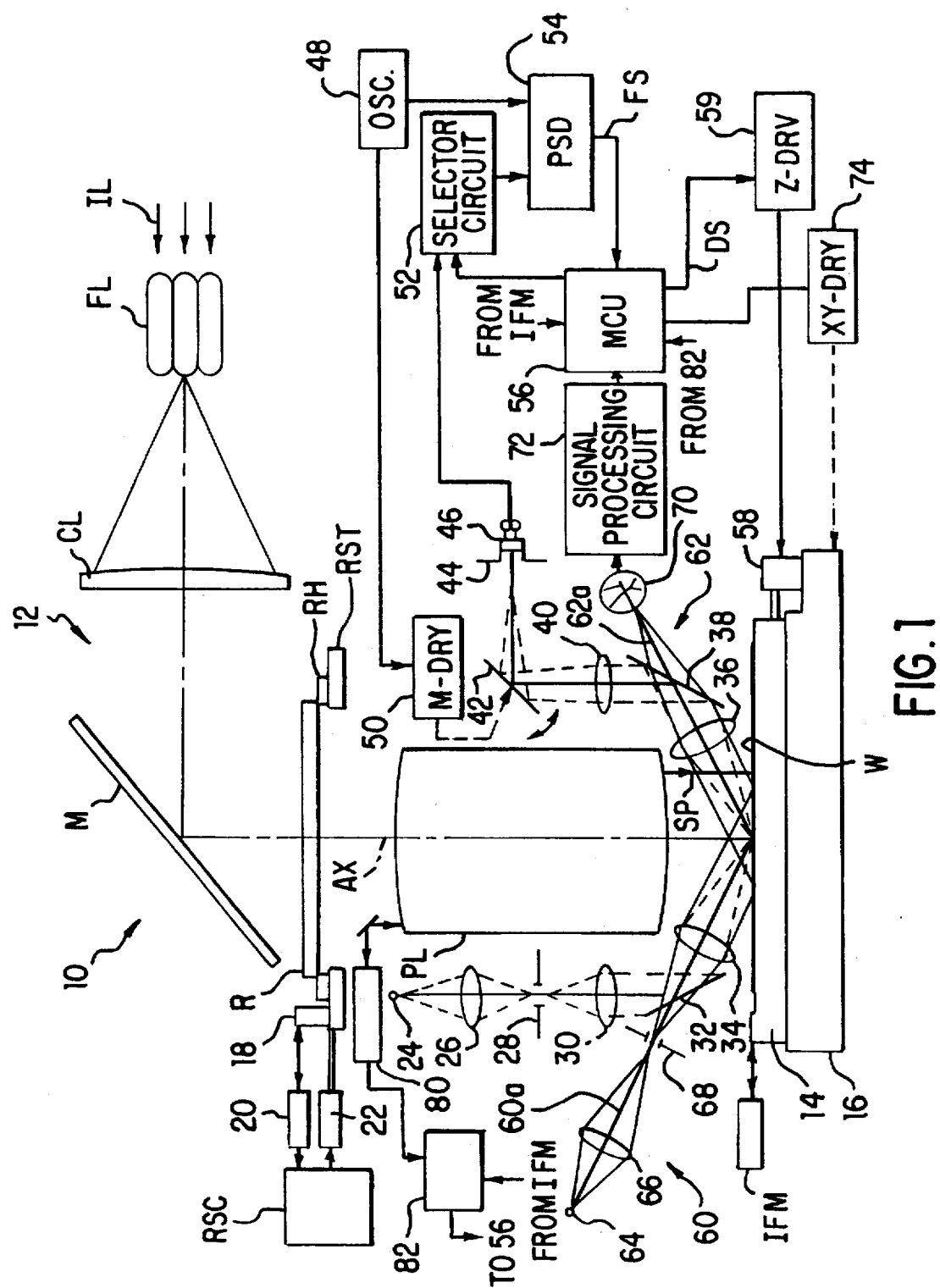
FIG. 1 shows a schematic arrangement of a step-and-repeat type exposure apparatus according to Embodiment 1.

FIG. 1 schematically shows an arrangement of an exposure apparatus 10 according to Embodiment 1. This exposure apparatus 10 is a reduction projection type exposure apparatus of the step-and-repeat system, that is a so-called wafer stepper, in which a transfer area (pattern area) PA on a reticle R as a mask is irradiated with an illumination light beam IL for exposure, and a wafer W as a photosensitive substrate is successively moved so that a pattern (reticle pattern) formed on the back surface of the reticle R is successively transferred onto a plurality of shot areas on the wafer W through a projection optical system PL.

The exposure apparatus 10 generally comprises an illumination optical system 12, a projection optical system PL, a leveling stage 14 as a movable member, an XY-stage 16 as a substrate stage, a first detecting means, a second detecting means, and a control system.

Among them, the illumination optical system 12 has a fly eye lens FL as an optical integrator for improving uniformity of illuminance on the reticle R for the illumination light beam IL from a mercury lamp (not shown), a condenser lens CL for collecting the illumination light beam IL outgoing from the fly eye lens FL, and a mirror M for reflecting the illumination light beam IL collected by the condenser lens CL and converting its direction by 90 degrees.

Ahead of the traveling direction of the illumination light beam IL reflected by the mirror M, the projection optical system PL is arranged with its optical axis AX directed in the vertical direction.

The reticle R is arranged perpendicularly to the optical axis AX between the mirror M and the projection optical system PL. A pattern area PA comprising a chromium layer is formed on the back surface of the reticle R. The reticle R is placed on a reticle stage RST capable of reciprocating movement in right and left directions in FIG. 1 (X-axis direction) on a plane perpendicular to the optical axis AX, and it is held by a reticle holder RH. Actually, the reticle stage RST is constructed such that it is movable along a main column body (not shown) on which the projection optical system PL is held.

A reflection mirror 18 is provided to extend along a direction (Y-axis direction) perpendicular to the plane of the paper at one end (left end in FIG. 1) of the reticle stage RST. Opposing to the reflection mirror 18, a laser interferometer 20 is provided for detecting the movement position of the reticle stage RST. A reticle stage controller RSC drives and controls a motor 22 so that the reticle stage RST is positioned at a predetermined position (for example, a target position for alignment of the reticle R and the wafer W instructed by a main control unit (MCU) 56) on the basis of an output of the laser interferometer 20. Thus the reticle R is positioned at a predetermined position in a manner as described above.

In this Embodiment, the projection optical system PL is of a bitelecentric system, having a projection magnification of ⅕.

The leveling stage 14 described above is arranged under the projection optical system PL such that the leveling stage 14 is approximately perpendicular to the optical axis AX. A wafer holder (not shown) is provided on the leveling stage 14. The wafer W is vacuum-sucked and held by the wafer holder. The leveling stage 14 is constructed such that the movement in the direction of the optical axis AX and the inclination with respect to the XY-plane can be adjusted by a stage adjusting mechanism (not shown, but including a driving system 58), for example, which is comprised of three expandable members such as piezoelectric elements.

The leveling stage 14 is placed through the stage adjusting mechanism on the XY-stage 16 which is constructed so as to be movable along the directions of the X-axis and the Y-axis on a plane perpendicular to the optical axis AX.

The wafer W is held on the leveling stage 14 so that its surface is conjugate with the pattern plane of the reticle R relative to the projection optical system PL. Therefore, in a state in which the reticle R is positioned at a predetermined position, the illumination light beam IL emitted from a light source (not shown) passes through the illumination optical system 12 (FL, CL, M), and illuminates the reticle R. The illumination light beam IL having passed through the reticle R passes through the projection optical system PL, and it is focused on the wafer W. Thus the image of the pattern formed on the back surface of the reticle R is reduced and projected onto a resist layer on the wafer W.

Next, the construction of the first detecting means for optically detecting the positional change of the surface of the wafer W in the direction of the optical axis AX will be explained together with the function of each part of the construction. A multiple-point autofocus system of the oblique incidence illumination type is adopted as the first detecting means. The multiple-point AF system herein refers to a system in which position-measuring points for measuring positional discrepancy (so-called focal shift) of the wafer W in the direction of the optical axis AX are provided at a plurality of points in an image field (projection field) of the projection optical system PL.

The first detecting means comprises a second light source 24, a condenser lens 26, a diaphragm 28 having a plurality of projection slits (linear apertures), a collimator lens 30, a first dichroic mirror 32, an irradiation objective lens 34, a light-receiving objective lens 36, a second dichroic mirror 38, a condenser lens 40, a vibration mirror 42, a diaphragm 44 having a light-receiving slit (linear aperture), and a light-receiving element 46.

The construction will be described in further detail below. The second light source 24 emits a light beam which is non-photosensitive to the resist on the wafer W and has a wavelength different from that of the exposure light source included in the illumination optical system 12. The light beam outgoing from the second light source 24 is collected by the condenser lens 26 onto the diaphragm 28, which is converted into a parallel light beam by the collimator lens 30, and arrives at the first dichroic mirror 32. The parallel light beam reflected by the first dichroic mirror 32 is focused by the irradiation objective lens 34 onto its focal position, and irradiates the wafer W obliquely. In this situation, when the surface of the wafer W is on the best image formation plane of the projection optical system PL, a plurality of slit images originating from the diaphragm 28 are formed on the surface of the wafer W by the collimator lens 30 and the irradiation objective lens 34. The angle between an optical axis (60a) of the irradiation objective lens 34 and the surface of the wafer W is set to be about 5–12 degrees. The center of the slit images originating from the diaphragm 28 is located on a point of intersection between the optical axis AX of the projection optical system PL and the wafer W.

The light beam reflected by the wafer W comes into the light-collecting objective lens 36 arranged such that its optical axis (62a) is symmetrical with the optical axis of the irradiation objective lens 34 relative to the optical axis AX of the projection optical system PL. The light beam passed through the light-collecting objective lens 36 and reflected by the second dichroic mirror 38 is subjected to image reconstruction on the diaphragm 44 through the condenser lens 40 and the vibration mirror 42.

The vibration mirror 42 minutely vibrates a slit image to be reconstructed on the diaphragm 44 in a direction perpendicular to its longitudinal direction. In this Embodiment, the vibration mirror 42 is vibrated by a mirror-driving unit (M-DRV) 50 driven by a vibration signal from an oscillator (OSC.) 48.

When the slit image vibrates on the diaphragm 44 as described above, the light beam passed through the slit of the diaphragm 44 is received by the light-receiving element 46. An array sensor, for example, an array sensor of silicon photodiode or phototransistor is used as the light-receiving element 46 in this Embodiment, in which the slit of the diaphragm 44 is divided for its longitudinal direction into a plurality of minute areas, and individual photoelectric cells are arranged for each of the minute areas.

Signals from each of the light-receiving cells of the array sensor constituting the light-receiving element 46 are selected or grouped through a selector circuit 52, and inputted into a synchronous detection circuit (PSD) 54. An alternating current signal having the same phase as that of the driving signal from OSC. 48 is inputted into PSD 54. The phase of the alternating current signal is used as a reference to perform synchronous rectification. PSD 54 is provided with a plurality of detection circuits for performing synchronous detection individually for each of output signals of a plurality of light-receiving cells selected from the light-receiving element 46 in this operation. Each of detection output signals FS therefrom are outputted to a main control unit (MCU) 56. The detection output signal FS is a so-called S-curve signal, which is at a zero level when the slit center of the diaphragm 44 coincides with the vibration center of the reflected slit image from the wafer W. It is at a positive level when the wafer W is replaced upwardly from the state described above, or at a negative level when the wafer W is replaced downwardly. Therefore, the position in height (position in the direction of the optical axis AX) of the wafer W at which the output signal FS is at the zero level is detected as a focusing point.

Namely, the main control unit (MCU) 56 is provided with an autofocusing (AF) mechanism in which a control signal is outputted to a circuit (Z-DRV) 59 for driving the driving system 58 which constitutes the stage adjusting mechanism (not shown) for adjusting the position in the optical axis and the inclination of the leveling stage 14 on the basis of each of the output signals FS of the multiple-point AF system, and thus focusing is performed as described above.

In the case of such an oblique incidence illumination system, it is not necessarily guaranteed that the position in height of the wafer W which provides the focusing point (with the output signal FS at the zero level) always coincides with the best image formation plane. Namely, the oblique incidence illumination system has an imaginary reference plane which is determined by the system itself. The output signal FS of PSD is at the zero level when the wafer surface coincides with the reference plane. The reference plane and the best image formation plane are set upon production of the apparatus or at other opportunities so that they are coincident as accurately as possible. However, it is not guaranteed that they are coincident over a long period. Thus the following technique may be used. Namely, a plane-parallel is provided between the vibration mirror 42 and the diaphragm 44, with which the relative relationship between the slit on the diaphragm 44 and the vibration center of the reflected slit image from the wafer W is shifted in the direction perpendicular to the longitudinal direction of the slit. The imaginary reference plane is replaced in the direction of the optical axis AX by inclining the plane-parallel so that the reference plane coincides with the best image formation plane (or the positional relationship is regulated).

Next, the second detecting means for optically detecting the inclination of the surface of each shot area on the wafer W with respect to the plane (XY-plane) perpendicular to the optical axis AX, that is the image formation plane of the projection optical system PL, will be explained together with the function of each part of the construction.

The second detecting means is a sensor for chip leveling, comprising an irradiation optical system 60 and a light-collecting optical system 62, which will be described in further detail below. The irradiation optical system 60 comprises a third light source 64, a condenser lens 66, a diaphragm 68 having a minute circular aperture, and the irradiation objective lens 34 described above. The condenser lens 66 forms an image of the light source 64 on the diaphragm 68. A parallel light beam is supplied onto the wafer W by the irradiation objective lens 34 having its focal point on the diaphragm 68.

In order to prevent the resist on the wafer W from photosensitization, the light beam supplied from the irradiation optical system 60 is a light beam having a wavelength which is different from that of the illumination light beam IL for exposure, and which is also different from that of the light beam emitted from the second light source 24 in this Embodiment.

The light-collecting optical system 62 comprises the light-receiving objective lens 36 described above and a quartered light-receiving element 70. The light beam supplied from the irradiation optical system 60 and reflected by the wafer W is collected by the light-receiving objective lens 36 onto the quartered light-receiving element 70 provided at its focal position. As described above, the optical axis 60a of the irradiation optical system 60 is symmetrical with the optical axis 62a of the light-receiving optical system 62 relative to the optical axis AX of the projection optical system PL. Therefore, when the exposure area on the wafer W maintains a perpendicular state with respect to the optical axis AX, the light beam from the irradiation optical system 60 is collected onto a central position of the quartered light-receiving element 70. On the other hand, when the exposure area on the wafer W is inclined by θ from the perpendicular state (inclined by θ with respect to the XY-plane), the parallel light beam from the irradiation optical system 60 reflected by the wafer W is collected at a position deviating from the center on the quartered light-receiving element 70 because it is inclined by $2_θ$ with respect to the optical axis 62a of the light-receiving optical system 62.

A signal corresponding to the position of the light-collecting point on the quartered light-receiving element 70 is inputted into MCU 56 through a signal processing circuit 72. Accordingly, MCU 56 detects the direction of inclination of the exposure area on the wafer W on the basis of the output signal from the signal processing circuit 72, generates a control signal DS corresponding to a direction and an amount of replacement of the light-collecting point on the quartered light-receiving element 70, and outputs it to the circuit (Z-DRV) 59 for driving the driving system 58 of the adjusting mechanisms for the leveling stage 14. Thus Z-DRV 59 allows the leveling stage 14 to move so that the inclination of the surface of the exposure area on the wafer W is corrected. Chip leveling is performed in a manner as described above.

The movement position of the XY-stage 16 (X-Y coordinate position) is measured by laser interferometers IFM (although the laser interferometer is illustrated in FIG. 1 as only one for X-axis, actually one for Y-axis is also present). Output signals of these laser interferometers IFM are inputted into MCU 56. Therefore, MCU 56 also has a function to control XY-DRV 74 so that the shot areas on the wafer W are successively exposed while monitoring the movement position of the XY-stage 16 by using the outputs of the interferometers IFM.

In FIG. 1, the light beam for the leveling sensor is illustrated with solid lines, and the light beam for the multiple-point AF system is illustrated with dotted lines.

In this Embodiment, as shown in FIG. 1, an alignment sensor 80 of the TTL (Through The Lens) system is provided, as disclosed, for example, in U.S. Pat. No. 4,677, 301, which is incorporated herein by reference. When a slender band-shaped spot light image SP extending in the X direction is formed on the wafer W through the projection optical system PL, and the spot light image SP and alignment marks (diffraction grating marks) affixed to the shot areas on the wafer W are relatively scanned in the Y direction by finely moving the XY-stage 16, then the alignment sensor 80 photoelectrically detects, for example, ± primary to ± tertiary diffracted light emitted from the marks, through the projection optical system PL. A photoelectric signal corresponding to an intensity of the diffracted light outputted from the alignment sensor 80 is inputted into a signal processing circuit 82 together with the positional signal from the interferometers IFM for measuring the movement position of the XY-stage 16. The signal processing circuit 82 samples photoelectric signals in synchronization with up-down pulses generated for every unit of movement amount of the XY-stage 16, and converts each of sampling values into digital values to store them in a memory in an order of address. It subsequently calculates coordinate positions of the alignment marks in the Y direction by means of predetermined operation processing, and outputs information thereon to the main control unit (MCU) 56.

Next, an exposure method by using the exposure apparatus 10 of Embodiment 1 constructed as described above will be explained with reference to a flow chart in FIG. 2 which illustrates a principal control algorithm for MCU 56. This flow chart starts when an instruction command to start exposure is inputted into MCU 56 from an operation unit (not shown). It is assumed herein that a plurality of chip patterns (shot areas) have been formed on the wafer W. Accordingly, an operation will be explained in which the shot areas are exposed again with the pattern on the reticle R so that the pattern overlay onto the formed chip patterns.

At first, in a step 100, an orientation flat of the wafer W is used to perform prealignment of the wafer. Namely, a controller for a wafer prealignment unit (not shown) positions a turn table which constitutes the wafer prealignment unit in accordance with an instruction command from MCU 56 so that the orientation flat of the wafer W approximately coincides with the X-axis direction.

In the next step 102, the wafer W is loaded and sucked onto the leveling stage 14. More specifically, a controller for a wafer autoloader (not shown) receives a control signal from MCU 56. The wafer W is conveyed from the turn table by using a loading arm (not shown) in a state in which the orientation flat is maintained to be parallel to the X-axis, and it is placed on a wafer holder (not shown). When a suction pump (not shown) is driven in this state, the wafer W is vacuum-sucked to the wafer holder.

In the next step 104, an alignment system of the off-axis type (not shown) is used to correct the rotation amount of the wafer W. Spot light beams spaced apart by a predetermined distance are used to detect alignment mark positions on the wafer in accordance with a known technique, for example, as disclosed in U.S. Pat. No. 4,780,617. Thus the rotation of the wafer holder is controlled to perform global alignment (correction for the rotation amount of the wafer W). The description in U.S. Pat. No. 4,780,617 is incorporated herein by reference.

In the next step 106, EGA (Enhanced Global Alignment) measurement is performed in order to determine the positions (x,y) of the shot regions on the wafer W on an orthogonal coordinate system XY specified by the laser interferometers IFM. In this measurement, the first detecting means is used to measure positions in the direction of the optical axis AX for shots which are subjected to the EGA measurement respectively. The processing in the step 106 will be described in further detail below.

At first, the EGA system will be explained. The EGA system is disclosed in U.S. Pat. No. 4,780,617, in which the regularity of the shot array on the wafer is accurately specified by using a statistical technique. The description of U.S. Pat. No. 4,780,617 is incorporated herein by reference. This system may be described in further detail as follows. When the pattern on the reticle is subjected to overlay exposure on each of a plurality of shot areas (chip pattern) on the wafer, a satisfactory overlay accuracy is not necessarily obtained due to the following factors (1)–(4), even if the wafer is positioned in accordance with a known array coordinate (for example, designed values):

(1) residual rotational error θ of the wafer (shot array) with respect to the coordinate system XY;

(2) orthogonality error w of the coordinate system XY (or shot array);

(3) linear expansion or shrinkage Rx, Ry of the wafer in the X, Y directions;

(4) Offset Ox, Oy of the wafer (shot array) in the X, Y directions.

These four types of error amounts can be represented by using the six parameters (θ, w, Rx, Ry, Ox, Oy). Accordingly, the EGA system introduces a transformation matrix A of 2 rows×2 columns comprising elements represented by four parameters (θ, w, Rx, Ry) of the six, and a transformation matrix 0 of 2 rows×1 column using the offset Ox, Oy as its elements. Further, it is assumed that a designed array coordinate (Dxn, Dyn) (provided that n=1, 2, . . . ) of each shot area on the wafer, and an actual array coordinate value (Fxn, Fyn) to be subjected to positional adjustment in the step-and-repeat system are expressed by the following expression by using the transformation matrices A and O:

$$\begin{bmatrix} Fxn \\ Fyn \end{bmatrix} = A \begin{bmatrix} Dxn \\ Dyn \end{bmatrix} + O \quad (1)$$

Herein the residual rotational error θ, and the orthogonality error w are minute. Thus the transformation matrices A and O are approximately expressed by the following expression:

$$A = \begin{bmatrix} Rx & -Rx(w+\theta) \\ Ry \cdot \theta & Ry \end{bmatrix} \quad O = \begin{bmatrix} Ox \\ Oy \end{bmatrix} \quad (2)$$

Thus in the EGA system, array coordinate values of all shot areas on the wafer are determined as follows.

At first, a certain plurality of shot areas (alignment shots) (at least three are necessary, usually about 8–15 individuals) are preselected from a plurality of shot areas arranged on the wafer. Their array coordinates (FMxn, FMyn) are measured by detecting their affixed alignment marks for each of them by using the alignment sensor 80. Subsequently, the transformation matrices A and 0 are determined so that the deviation between a measured array coordinate value (FMxn, FMyn) and a calculated array coordinate value (Fxn, Fyn) determined by the expression (1) is minimized for each of at least three alignment shots (hereinafter referred to as "EGA shot") by using, for example, a least square method. Namely, the elements of the transformation matrices A and 0 are determined respectively so that a residual square sum E represented by the following expression is minimized:

$$E = \Sigma\{(FMxn-Fxn)^2 + (FMyn-Fyn)^2\} \quad (3)$$

Next, array coordinate values of all of the shot areas on the wafer are determined by calculating the array coordinate values of all of the shot areas on the wafer in accordance with the expression (1) on the basis of the determined transformation matrices A and 0 and the designed array coordinate values (Dxn, Dyn). Thus the reticle pattern is transferred onto each of the shot areas on the wafer while stepping the XY-stage 16 definitely in accordance with the calculated array ordinates.

In this Embodiment, MCU 56 adopts the EGA system as described above in the step 106 to calculate coordinate positions of all shot areas on the wafer W, and gives an offset in an amount corresponding to a base line amount of the alignment sensor 80 (spacing distance between the irradiation position of the alignment sensor and the optical axis of the projection optical system) to each of the calculated coordinate positions. These coordinate positions are stored in an internal memory. Therefore, the projection image of the reticle pattern is accurately overlaid on each of the shot areas on the wafer W if the XY-stage 16 is positioned so that the stored coordinate position coincides with the measured value (coordinate position) obtained by the interferometer IFM.

Figure 7:
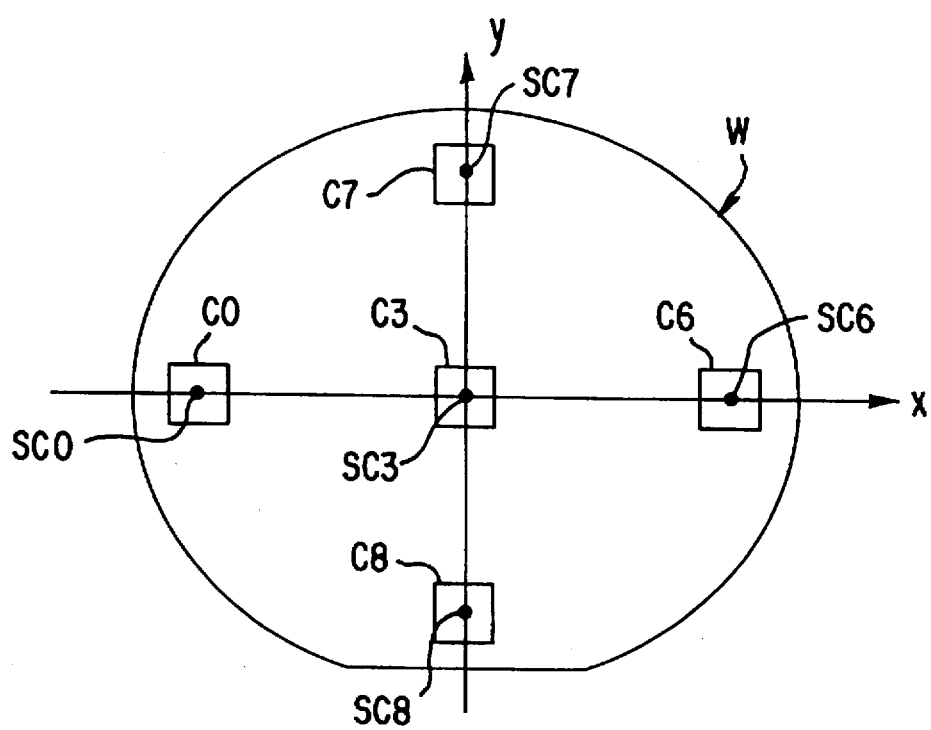
FIG. 7 is a conceptional plan view of a wafer in which at least three shot areas and position measuring points therein are shown.

In the step 106, the position of the shot surface in the direction of the optical axis AX is detected by using the first detecting means (multiple-point AF system) for m (integer, m≧3) individuals of the EGA shots on the wafer W respectively. At this time, the position in the direction of the optical axis is detected at a shot center for all of at least three of the EGA shots. This is for the following purpose. Namely, even if a difference in level (irregular portion of a pattern, such as groove, formed by previous exposure and development steps) is present in an EGA shot, the inclination amount of the wafer W is accurately determined without being affected thereby by performing the measurement at the identical position for each of the EGA shots as described above. The position-measuring point by the first detecting means is herein set at the shot center SC0 (SC3, SC6, SC7 and SC8) of alignment shot areas C0 (C3, C6, C7 and C8) as shown in FIG. 7a, however, the position-measuring point may be set at any optional positions in the EGA shot provided that it is located at an identical position through each of the plurality of EGA shots.

In the step 106, the position in the direction of the optical axis is detected for all of the EGA shots on the wafer. However, the number of EGA shots for which the position-measuring point is set is not limited provided that it is not less than 3. Further, at least one shot area other than the EGA shots may be selected to detect its position in the direction of the optical axis together with the EGA shots. Namely, the shot area for which the position-measuring point is set is not relevant to whether or not it is an EGA shot. Selection may be made so that the total number is not less than 3. However, taking the throughput into consideration, all of shot areas for which the position-measuring point is set are desirably included in the at least three EGA shots used in the EGA system described above.

Each of the shot areas on the wafer W usually has two sets of one-dimensional alignment marks, and the EGA system has the six parameters as described in the expression (2). Therefore, three or more EGA shots are required for the EGA system described above. However, the number of EGA shots required to the minimum increases or decreases depending, for example, on the number of parameters included in a model expression (for example, expression (1)) for representing the regularity of the shot array, and on whether or not the alignment mark is one-dimensional or two-dimensional. Namely, in the global alignment system which uses the statistical technique, the minimum value of the number of EGA shots is not limited to three, but it is adequately determined depending, for example, on the number of parameters of a model expression.

In the foregoing explanation, one position-measuring point is set for each of at least three shot areas. However, two or more position-measuring points may be set for one shot area. Alternatively, at least one position-measuring point may be set outside the shot areas on the wafer W, for example, on a street line for comparting the shot areas, or in an area at a periphery of the wafer on which no chip pattern is formed. Namely, the position-measuring point described above may be set at any optional position on the wafer W. Essentially, it is sufficient that the number thereof is at least three. However, at least three of them are prohibited from alignment on an identical straight line.

In the next step 108, the inclination amount of the entire wafer W (global leveling amount) with respect to the image formation plane of the projection optical system PL is determined on the basis of the positions of the three or more points on the surface of the wafer W in the direction of the optical axis AX determined in the step 106. The inclination amount may be determined such that a surface of the wafer W is determined by approximation in accordance with statistical processing such as least square approximation, and the approximated surface is used to determine the inclination amount. Alternatively, the inclination amount may be determined according to distances between the position-measuring points on the wafer W and differences between the positions in the direction of the optical axis at the position-measuring points when the number of measured shots is small.

In the next step 110, MCU 56 outputs a control signal for driving the XY-stage 16 in an amount corresponding to the position determined in the step 106 to XY-DRV 74 in order to position a first shot at an exposure position in the image field (projection field) of the projection optical system PL for exposure. Thus the movement of the XY-stage 16 is started. During this process, a control signal is outputted to Z-DRV 59 so that the inclination amount of the leveling stage 14 is corrected by the inclination amount of the entire wafer determined in the step 108 described above. Thus the driving system 58 which constitutes the adjustment mechanism is driven by Z-DRV 59, and global leveling is performed during the movement of the XY-stage 16.

In the next step 112, leveling and focusing are performed simultaneously with the operation for positioning the shot area in the X, Y directions. Specifically, the XY-stage 16 is driven by using XY-DRV 74 to perform positioning while monitoring the output of the interferometer IFM so that the first shot is positioned at an XY coordinate position for the first shot determined in the step 106 described above. Immediately after the positioning, the second detecting means (leveling sensor) is used to perform chip leveling for the first shot as described above, and the first detecting means (multiple-point AF system) is used to perform the autofocusing as described above. Thus the surface of the first shot accurately coincides with the image formation plane of the projection optical system PL. Namely, the surface of the first shot is set within the depth of focus of the projection optical system PL over its entire surface.

In the next step 114, a control signal is sent to an exposure controller (not shown) to perform exposure. Further, a focal discrepancy amount generated upon movement to the next shot is calculated on the basis of an inclination amount of the leveling stage 14 (obtained during the chip leveling), and it is stored in an internal memory (not shown).

This operation is performed because of the following reason. The first shot has its surface which accurately coincides with the image formation plane of the projection optical system PL owing to the chip leveling and the focusing operation in the step 112. However, on the other hand, a shot area (second shot), which is adjacent to the first shot and onto which the reticle pattern is subsequently transferred, has its surface which is discrepant with the image formation plane of the projection optical system PL. The amount of discrepancy can be corrected by a focusing operation for the second shot. However, the amount of movement of the leveling stage 14 in the direction of the optical axis in the focusing operation may become large depending on a result of the chip leveling. For this reason, in each of the second shot area and followings, the time required to perform the focusing operation increases, and the throughput decreases. Thus in the step 114, the focal discrepancy amount for the second shot depending on the inclination amount of the leveling stage 14 for the first shot is calculated in order to shorten the time for the focusing operation for the second shot, in other words, in order to decrease the amount of movement of the leveling stage 14 during the focusing operation for the second shot by finely moving the leveling stage 14 in the direction of the optical axis during stepping of the XY-stage 16. Namely, MCU 56 estimates the discrepancy amount (focal discrepancy amount) of the surface in the direction of the optical axis AX with respect to the image formation plane of the projection optical system PL for the second shot generated as a result of the chip leveling, on the basis of a distance (step pitch) between centers of the first and second shots.

Next, the routine proceeds to a step 116 to judge whether or not exposure is completed for all shots to be exposed. If this judgment is negated, the routine proceeds to a step 118. In order to position a shot area at the exposure position for exposure of the next shot, MCU 56 outputs a control signal to XY-DRV 74 to start movement of the XY-stage 16 so that the XY-stage 16 is driven by an amount corresponding to the position determined in the step 106. During this process, a control signal is outputted to Z-DRV 59 so that the leveling stage 14 is driven along the direction of the optical axis AX by the focal discrepancy amount stored in the internal memory in the step 114 described above. Thus coarse focusing is performed until the positioning for the next shot at the exposure position is completed.

After that, the routine returns to the step 112, followed by repetition of a loop comprising the steps 112→114→116→118→112. During this process, exposure is completed for all shots. If the judgment in the step 116 is affirmed, the routine proceeds to a step 120. The wafer is unloaded, and then the processing by this control routine ends.

According to the exposure method of Embodiment 1 explained above, the chip leveling is performed in the step 112 after the inclination of the entire wafer W is adjusted in the step 110 (global leveling). Thus it is sufficient to slightly correct the inclination during the chip leveling. In addition, the coarse focusing is achieved in the step 118 during movement to the next shot. Thus a focused state can be obtained with no movement or with movement of the leveling stage 14 in an extremely minute amount in the direction of the optical axis AX when the next shot is actually positioned at the exposure position. Therefore, the leveling operation and the focusing operation are divided, and the global leveling (step 110) and the shift of the leveling stage 14 in the direction of the optical axis (step 118) are executed concurrently with the movement operation for the XY-stage 16 separately from the leveling and the focusing operations for each shot area (step 112). Thus the operation for correcting the inclination of the leveling stage 14 and the focusing operation can be mostly accomplished during the movement of the XY-stage 16. Accordingly, an effect is obtained that the throughput scarcely lowers despite the fact that the leveling and the focusing operations are performed for each shot area.

As clarified from the foregoing explanation, MCU 56 manages the first leveling means, the first control means, the focusing means, the second leveling means, and the second control means in Embodiment 1. More specifically, both of the first leveling means and the second leveling means represent the leveling stage 14 which is driven under the control of MCU 56. The first control means represents XY-DRV 74 which is under the control of MCU 56, and the focusing means represents Z-DRV 59 and the leveling stage 14 which are under the control of MCU 56. The second control means represents MCU 56.

Embodiment 2

Figure 3:
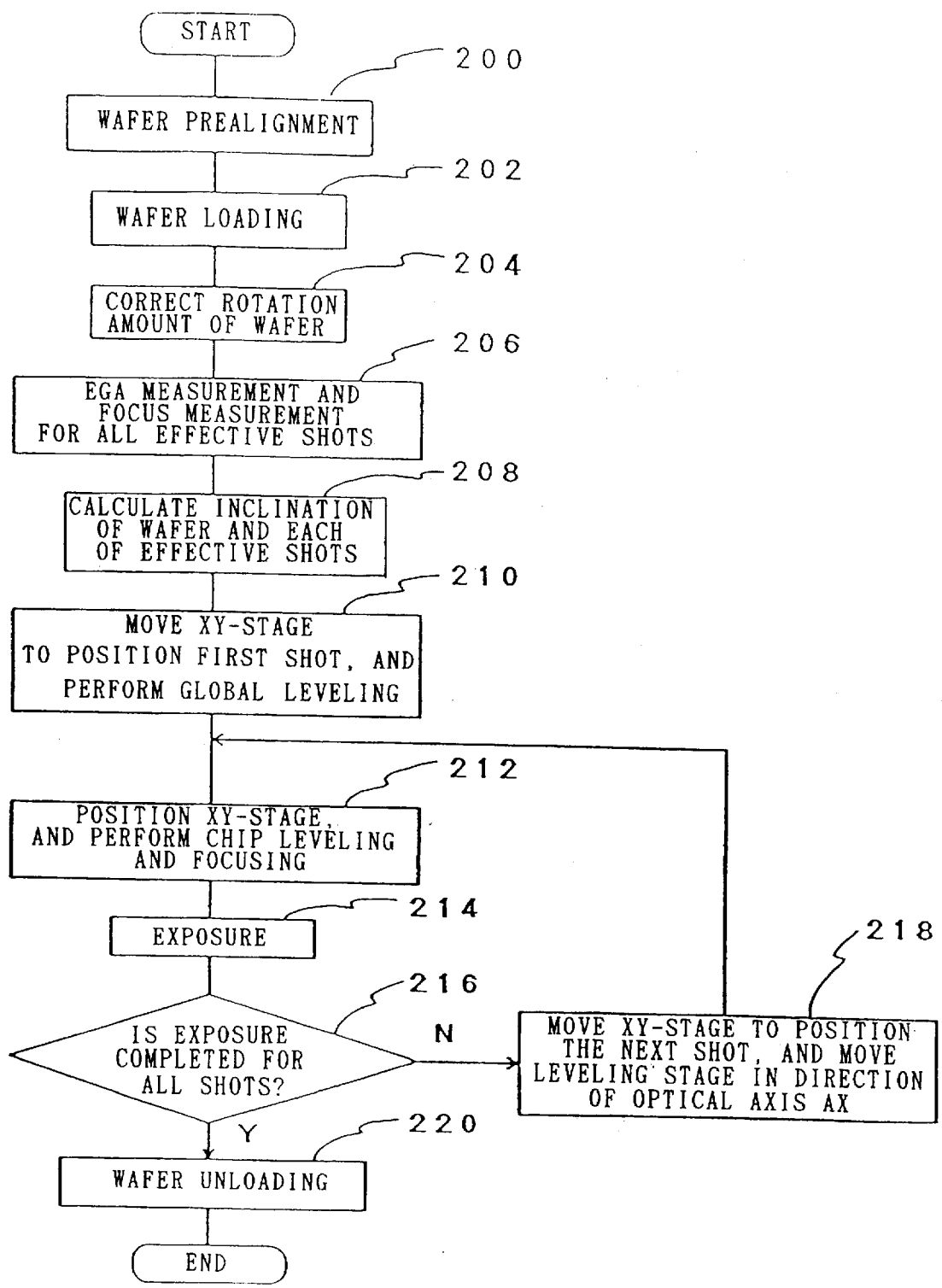
FIG. 3 shows a flow chart illustrating a principal control algorithm for MCU according to Embodiment 2.

Next, Embodiment 2 of the present invention will be described with reference to FIG. 3. In Embodiment 2, the control algorithm for MCU 56 during exposure is different from that in Embodiment 1 described above, however, the arrangement of each of the components is the same as that of Embodiment 1 except that the second detecting means (leveling sensor) is unnecessary. Accordingly, an exposure method by using an exposure apparatus of Embodiment 2 will be explained with reference to a flow chart in FIG. 3 which illustrates a principal control algorithm for MCU 56.

In steps 200–204, the processing is executed in the same manner as that in the steps 100–104 in Embodiment 1.

In the next step 206, EGA measurement is performed in the same manner as that in Embodiment 1 in order to determine coordinates of shot areas on a wafer W. Further, the first detecting means is used for all effective shots on the wafer W (shot areas onto which a reticle pattern can be transferred and on which at least one chip can be secured in a complete form with no partial deficiency) respectively to measure positions on their surfaces in the direction of the optical axis AX by using optional points in shot areas having relatively small process differences in level as position-measuring points. Measured values are stored in an internal memory (not shown).

All (N individuals) effective shots are EGA shots in the EGA measurement since the position in the direction of the optical axis is detected for all of the effective shots on the wafer W respectively. Namely, in the EGA measurement, the coordinate position is detected by using the alignment sensor 80 for all of the effective shots on the wafer W respectively. Further, the transformation matrices A and 0 in the expression (1) are determined in accordance with statistical operation (for example, approximation by the least square method) by using all coordinate positions. Moreover, the coordinate positions of all of the shot areas on the wafer W are calculated by using the determined transformation matrices A and 0.

In the next step 208, the inclination amount (global leveling amount) of the entire wafer is determined on the basis of the positions on all of the effective shot surfaces in the direction of the optical axis AX determined in the step 206. The inclination amount is calculated and determined by statistical processing such as approximation by the least square method in the same manner as in the step 108 in Embodiment 1 (FIG. 2).

In the step 208, the inclination amount is calculated and stored in the internal memory for each of the effective shots on the basis of the positions on all (N individuals) of the effective shot surfaces in the direction of the optical axis determined in the step 206. For example, the inclination amount of the first shot is calculated by using positional data for the first shot and at least one shot area adjacent thereto respectively among the positional data stored in the step 206. More specifically, an approximated plane for the first shot is calculated by statistical operation (approximation by the least square method) by using a plurality of positional data, and the inclination amount of the first shot is determined from the approximated plane. Alternatively, the inclination amount of the first shot may be determined from a deviation between two positional data and a distance between shot areas for which the positional data are detected. The positional datum for the first shot is used herein. However, the inclination amount of the first shot may be determined by using only positional data for a plurality of shot areas adjacent to the first shot respectively. Further, the inclination amount of a shot area is desirably determined by using at least three positional data regardless of whether or not a positional datum for the area is used. In the case of a shot area located in the vicinity of a center of the wafer W, its inclination amount is preferably calculated by using each of positional data for eight shot areas adjacent thereto. On the other hand, in the case of a shot area located in the vicinity of a periphery of the wafer W, the number of shot areas adjacent thereto is small. Thus it is desirable to use a positional datum of the area as well.

Figure 2:
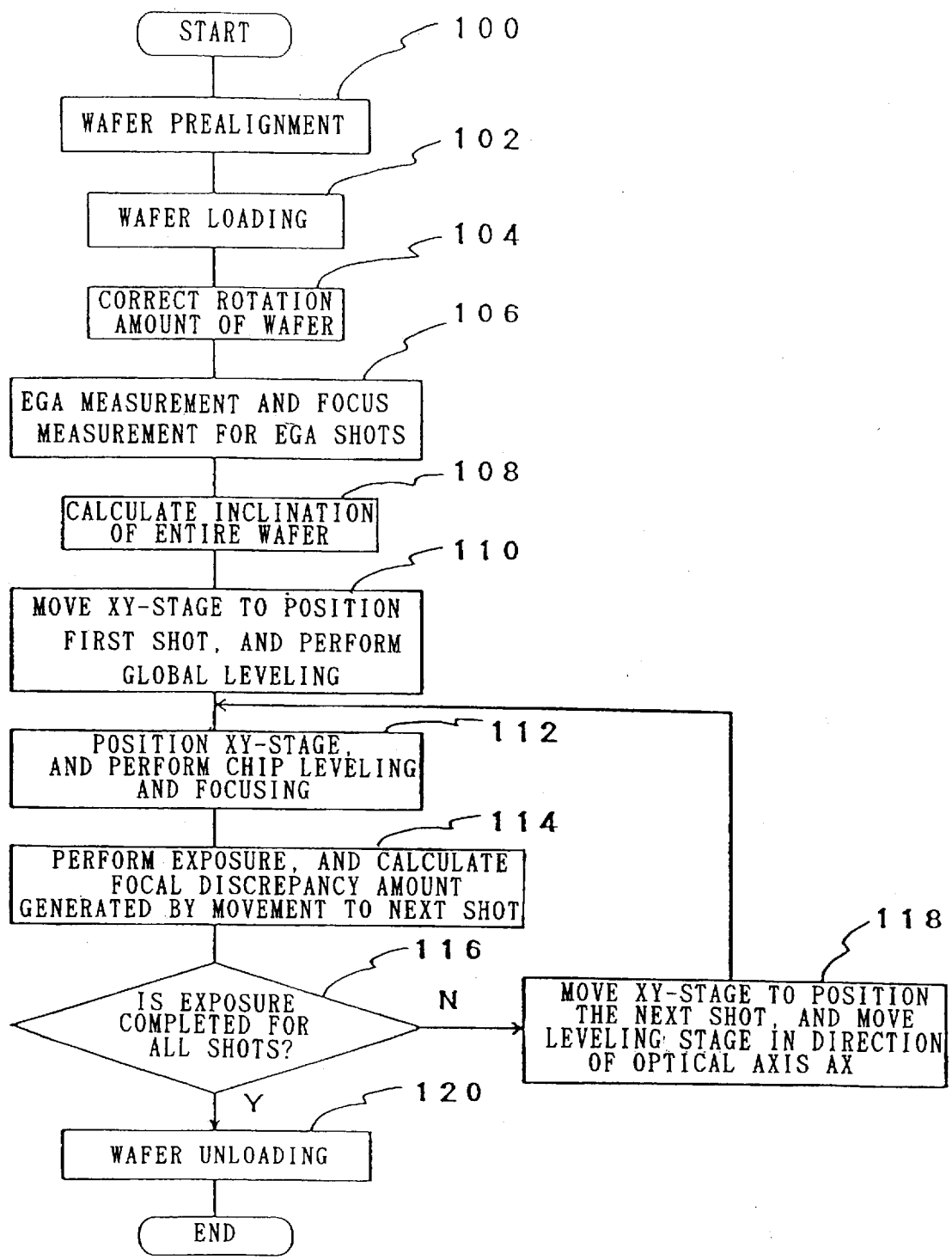
FIG. 2 shows a flow chart illustrating a principal control algorithm for MCU in FIG. 1.

In the next step 210, processing is performed in the same manner as in the step 110 in Embodiment 1 (FIG. 2).

In the next step 212, the XY-stage 16 is positioned in accordance with the coordinate position of the first shot determined in the step 206 in the same manner as in the step 112 in Embodiment 1 (FIG. 2). Immediately after the operation for the positioning, the focusing operation is executed by using the first detecting means (multiple-point AF system). A difference between the inclination amount of the wafer W calculated in the step 208 (global leveling amount) and the inclination amount of the first shot, that is a residual inclination amount of the first shot (corresponding to the chip leveling amount in Embodiment 2) is determined. The leveling stage 14 is inclined so that the residual inclination amount is zero. The foregoing is made because of the following reason. The entire surface of the wafer W is inclined in the global leveling in the step 210 so that it is approximately parallel to the image formation plane of the projection optical system PL, and hence the first shot on the wafer W having been subjected to the global leveling has its surface which is inclined in an amount corresponding to the aforementioned residual inclination amount with respect to the image formation plane of the projection optical system PL. Therefore, in the step 212, the chip leveling is performed, in which the leveling stage 14 is inclined by the residual inclination amount for each effective shot. The surface of the first shot accurately coincides with the image formation plane of the projection optical system PL owing to the focusing operation and the chip leveling.

In this Embodiment, the position in the direction of the optical axis is measured for all of the effective shots in the step 206. Therefore, the residual inclination amount (chip leveling amount) can be determined by calculation for each effective shot in the chip leveling in the step 202 without using the second detecting means (leveling sensor). In addition, if the residual inclination amount described above is not more than a predetermined allowable value, it is allowable that the leveling stage 14 is not inclined in order to suppress the decrease in throughput to the minimum. As described above, the difference between the inclination amount determined in the step 208 and the global leveling amount is the residual inclination amount of the first shot. However, in the case of a second shot and followings on the wafer W, for example, in the case of an nth (n is an integer, $2 \leq n \leq N$) effective shot, the residual inclination amount is a difference between its inclination amount and an inclination amount of a (n−1)th effective shot. The residual inclination amount of each of the effective shots on the wafer W is calculated by MCU and stored in its internal memory, for example, in the step 208.

In the next step 214, a control signal is sent to the exposure controller (not shown), and a projection image of the reticle pattern is overlaid on the first shot to perform exposure.

Next, the routine proceeds to a step 216. It is judged whether or not overlay exposure is completed for all of the effective shots on the wafer W. If the judgment is negated, the routine proceeds to a step 218. A control signal for driving the XY-stage 16 in an amount corresponding to a difference between a coordinate position determined in the step 206 and a present position of the XY-stage 16 (value measured by the interferometer IFM) is outputted to XY-DRV 74 to start movement of the XY-stage 16, in order to position a next effective shot at the exposure position for exposure of the effective shot.

When the second shot or the followings on the wafer W, for example, an nth effective shot is positioned, its surface is discrepant with the image formation plane of the projection optical system PL in the direction of the optical axis AX as a result of chip leveling for a (n−1)th effective shot. The amount of discrepancy (focal discrepancy amount) of the surface of the nth effective shot from the image formation plane can be determined by calculation from the residual inclination amount of each of the effective shots stored in the internal memory and the distance between centers of adjacent effective shots (step pitch). Thus in this Embodiment, MCU 56 calculates the focal discrepancy amount of each of the effective shots of the second shot and the followings, and stores it in the internal memory together with the residual inclination amount for each effective shot in the step 218.

Therefore, in the step 218, MCU 56 outputs a control signal corresponding to the focal discrepancy amount to Z-DRV 59 to drive the leveling stage 14 in the direction of the optical axis AX so that the focal discrepancy amount stored in the internal memory in the step 208 is made into zero, when the XY-stage 16 is driven to position the nth effective shot. Thus coarse focusing is performed until the nth effective shot is positioned at the exposure position.

If the focal discrepancy amount described above is not calculated in the step 208, the focal discrepancy amount generated during movement to the nth effective shot may be calculated in the step 214 or 218 by using the residual inclination amount (corresponding to the inclination amount of the leveling stage 14) of the (n−1)th effective shot determined in the step 208.

After starting the movement of the XY-stage 16 as described above, the routine returns to the step 212, followed by repetition of a loop comprising the steps 212→214→216→218→212. During this process, exposure is completed for all effective shots. If the judgment in the step 216 is affirmed, the routine proceeds to a step 220. The wafer is unloaded, and then the processing by this control routine ends.

According to the exposure method of Embodiment 2 explained above, an effect is obtained that the throughput scarcely lowers despite the fact that the leveling and focusing operations are performed for each chip in the same manner as in Embodiment 1. In addition, the focal discrepancy amount for a next shot area is not estimated from the inclination amount of the leveling stage 14 for a present shot area. The focal discrepancy amount for the next shot area is actually calculated on the basis of measurement data for the position on the surface of the wafer W in the direction of the optical axis AX actually measured for all effective shots.

Focusing is performed in the step 218 on the basis of the calculation result during movement to the next shot. Thus a state, which is closer to a state of true focusing position, is realized when the positioning is actually accomplished at the exposure position. Therefore, in the focusing operation at the exposure position, a focused state can be obtained by moving the leveling stage 14 in the direction of the optical axis AX in an amount corresponding to a focus offset detected by the first detecting means (multiple-point AF system), or without moving the leveling stage 14 at all if the focus offset is not more than a predetermined allowable value.

In Embodiment 2 described above, the chip leveling is performed in the step 212. However, the residual inclination amount for each effective shot is determined by calculation in the step 208 without using the second detecting means (leveling sensor). Therefore, the chip leveling can be also performed in the step 218 for the second shot and the followings on the wafer W. Namely, the leveling stage 14 is finely moved in the direction of the optical axis during the stepping of the XY-stage 16 so that the focal discrepancy amount described above is made into zero, and the leveling stage 14 is inclined in order that the residual inclination amount of the next effective shot is made into zero. Thus the chip leveling in the step 212 becomes unnecessary, and the throughput can be improved.

In Embodiment 2 described above, the calculation of the inclination amount of the wafer W (global leveling amount) in the step 208, and the global leveling in the step 210 may be omitted. In this procedure, the leveling stage 14 is inclined in the step 210 during the stepping of the XY-stage 16 so that the inclination amount of the first shot determined in the step 208 is made into zero. Thus the global leveling becomes unnecessary, and the chip leveling for the first shot can be performed during the stepping of the XY-stage 16. Therefore, the throughput can be greatly improved.

In Embodiment 2 described above, the focusing operation is performed by using the first detecting means (multiple-point AF system) in the step 212. However, it is also allowable that the focusing operation is not performed in the step 212, but the focusing operation is performed in the step 218 without using the first detecting means. Namely, for the second shot or the following on the wafer W, for example, for an nth effective shot, the leveling stage 14 is finely moved in the direction of the optical axis during the stepping of the XY-stage 16 in the step 218 on the basis of a difference between its position in the direction of the optical axis determined in the step 206 and a position of a (n−1)th effective shot in the direction of the optical axis (hereinafter referred to as "residual focus offset"), and the focal discrepancy amounts of the effective shots determined in the step 208. Thus the nth effective shot has its surface which coincides with the image formation plane of the projection optical system PL, and the focusing operation in the step 212 becomes unnecessary. Therefore, the throughput can be improved. According to the facts described above, Embodiment 2 provides its highest throughput in the case of a sequence in which the global leveling is omitted as described above, and the focusing operation and the chip leveling are performed during the stepping of the XY-stage 16.

The global leveling is performed in the step 210 in Embodiment 2 described above. Accordingly, the positional data for each of the effective shots are corrected by using the global leveling amount to calculate the residual focus offset by using the corrected positional data.

In Embodiment 2 described above, the positional data determined in the step 206 are used as they are to perform the focusing operation for the effective shots. However, the position of one effective shot in the direction of the optical axis may be calculated by using, for example, each of positional data for the effective shot and at least one effective shot adjacent thereto. Specifically, an approximated plane for the effective shot may be calculated in accordance with statistical operation by using a plurality of positional data (for example, approximation by the least square method), and the position in the direction of the optical axis may be determined from the approximated plane. Alternatively, the position in the direction of the optical axis may be determined by means of average processing or weighed average processing for a plurality of positional data.

In the focusing operation for the first shot on the wafer W, the position in the direction of the optical axis determined in the step 206 may be corrected by using the global leveling amount determined in the step 210, and the leveling stage 14 may be finely moved in the direction of the optical axis in accordance with a positional datum corrected as described above. On the other hand, if the global leveling is not performed as described above, the position in the direction of the optical axis determined in the step 206 may be used as it is, and the leveling stage 14 may be finely moved in the direction of the optical axis.

In Embodiments 1 and 2 described above, the overlay of the projection image of the reticle pattern with respect to each shot area (alignment) is performed by driving the XY-stage 16 and positioning each shot area on the wafer W at the exposure position in the steps 112 and 212. However, for example, the XY-stage 16 is used only for positioning the wafer W so that the shot area is set within the image field of the projection optical system PL. The alignment error between the shot area and the projection image of the reticle pattern detected by the interferometer IFM (deviation between the present position of the XY-stage 16 (value measured by the interferometer IFM) and the coordinate position of the shot area determined in the step 206) may be corrected by finely moving the reticle stage RST.

In Embodiments 1 and 2 described above, the multiple-point AF system is used as the first detecting means. However, a constant-point AF system may be used, in which a slit pattern is projected onto only one point on a wafer, and its pattern image is photoelectrically detected as disclosed, for example, in U.S. Pat. No. 4,650,983. This document is incorporated herein by reference. In the multiple-point AF system and the constant-point AF system, the position in the direction of the optical axis is detected at one or more predetermined points on the wafer without allowing the projection optical system PL to intervene. However, an arrangement is also available, in which a wafer is irradiated with an AF beam through the projection optical system PL, and a reflected light beam therefrom is photoelectrically detected through the projection optical system PL.

An air micrometer may be used instead of the optical sensor such as the multiple-point AF system or the constant-point AF system described above.

In Embodiment 1 described above, the leveling sensor of the collimator system is used as the second detecting means. However, the multiple-point AF system or the constant-point AF system described above may be used. Especially when the multiple-point AF system is used, it can be also used as the first detecting means, providing an advantage that the arrangement of the apparatus can be simplified.

Embodiment 3

In this Embodiment, an embodiment will be described with reference to FIGS. 4–6, in which the present invention is applied to a slit scan type (scanning type) projection exposure apparatus.

Figure 4:
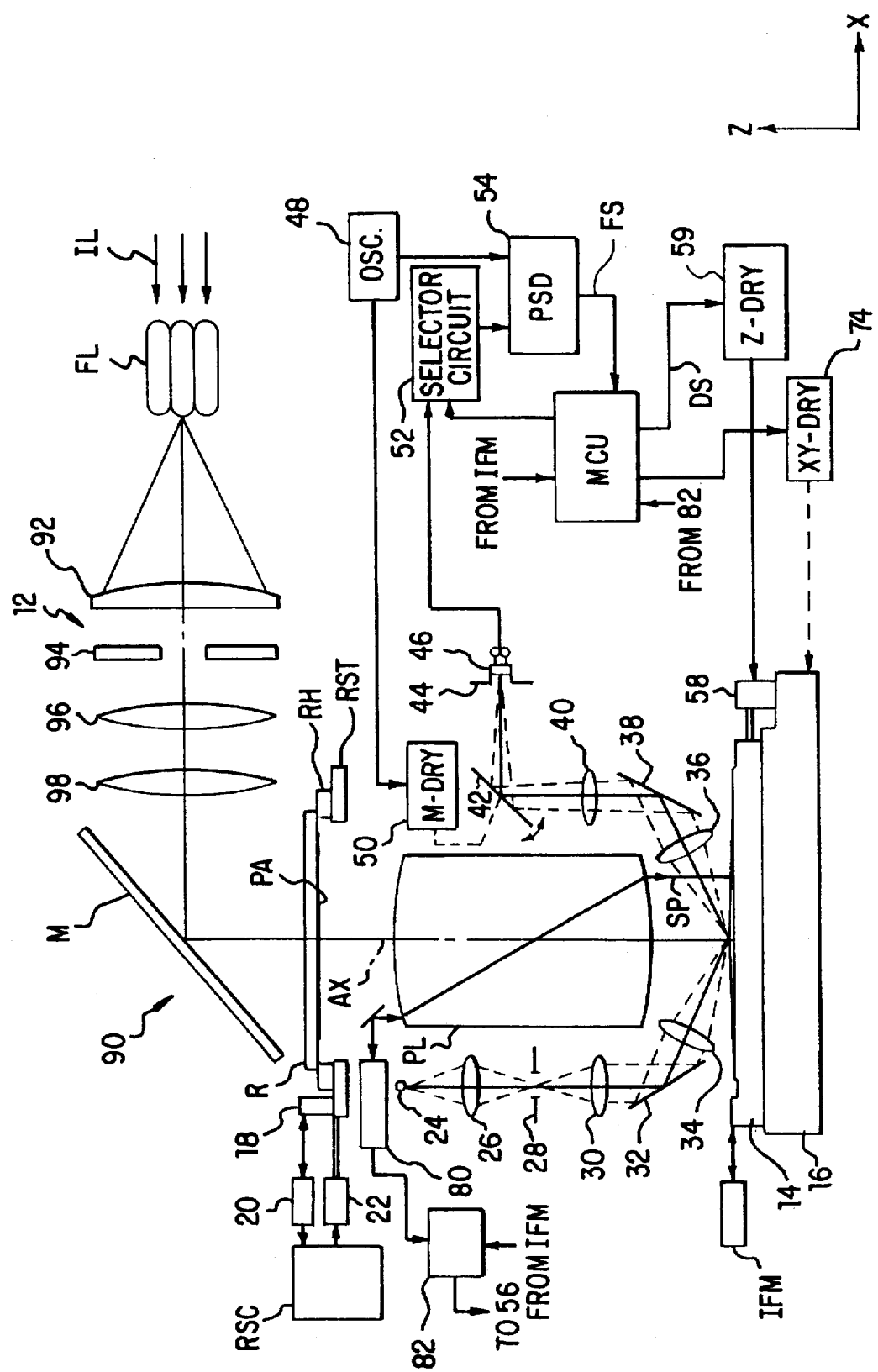
FIG. 4 shows a schematic arrangement of a slit scan type exposure apparatus according to Embodiment 3.

FIG. 4 shows a schematic arrangement of a slit scan type projection exposure apparatus 90. The slit scan type projection exposure apparatus 90 is an apparatus in which a wafer is successively exposed with a pattern on a reticle R by illuminating a part of a pattern area on the reticle R in a form of slit, scanning the reticle R with respect to an illuminated area (herein referred to as "illumination area", and scanning the wafer W in synchronization with the scanning for the reticle R with respect to an area in a conjugate relation (herein referred to as "exposure area") with the illumination area relative to a projection optical system PL. The exposure apparatus 90 generally comprises an illumination optical system 12, a projection optical system PL, a leveling stage 14 as a movable member, an XY-stage 16 as a substrate stage, a first detecting means, and a control system which are main components of the exposure apparatus 10 of the step-and-repeat system in FIG. 1. Thus as for the exposure apparatus 90, only apparatus arrangements and operations different from those of the exposure apparatus 10 in FIG. 1 will be explained, and explanation will be omitted for common apparatus arrangements and operations.

The illumination optical system 12 of the apparatus 90 generally comprises a fly eye lens FL, a relay lens 92, a movable blind 94, a mirror M, a relay lens 96, and a condenser lens 98. An illumination light beam IL outgoing from the fly eye lens FL is restricted by the movable blind 94 having an aperture which extends lengthwise in a direction (Y direction) perpendicular to the plane of the paper. Thus the illumination area on the reticle R also has a form of slit extending lengthwise in the Y direction.

In the slit scan type projection exposure apparatus 90, a reticle stage RST moves in a scanning direction (X axis direction) during exposure, and the reticle R is scanned with respect to the illumination area. A reticle stage controller RSC controls the movement stroke of the reticle stage RST so that all patterns in the reticle R pass through the illumination area in one time of scanning. On the other hand, the XY-stage 16 moves in an opposite direction in synchronization with the reticle stage RST, and the wafer W is scanned with respect to the exposure area. The movement speed ratio between the reticle stage RST and the XY-stage 16 is determined by a reduction magnification of the projection optical system PL. The synchronous movement of the reticle stage RST and the XY-stage 16 is controlled by the reticle stage controller RSC and a main control unit 56.

The slit scan type projection exposure apparatus 90 is provided with a multiple-point autofocus system of the oblique incidence illumination type as a means for optically detecting the positional change of the surface of the wafer W in the optical axis AX in the same manner as the exposure apparatus 10 in Embodiment 1. The multiple-point autofocus system generally comprises a second light source 24, a condenser lens 26, a diaphragm 28 having a plurality of projection slits, a collimator lens 30, a first dichroic mirror 32, an irradiation objective lens 34, a light-receiving objective lens 36, a second dichroic mirror 38, a condenser lens 40, a vibration mirror 42, a diaphragm 44 having a light-receiving slit, and a light-receiving element 46. However, in this Embodiment, the multiple-point autofocus system also functions as the chip leveling sensors 60, 62 which are the second detecting means in Embodiment 1 as described below. It can simultaneously measure the inclination amount of the wafer surface as well.

The diaphragm 28 of the multiple-point autofocus system is provided with five slit arrays aligned at predetermined spacing in the X direction, one slit array comprising nine slits aligned at constant spacing in the Y direction. A center of an image of a group of slits belonging to a central array (third array) concerning the projection optical system PL is located on a point of intersection between the wafer W and the optical axis AX of the projection optical system PL.

Figure 5:
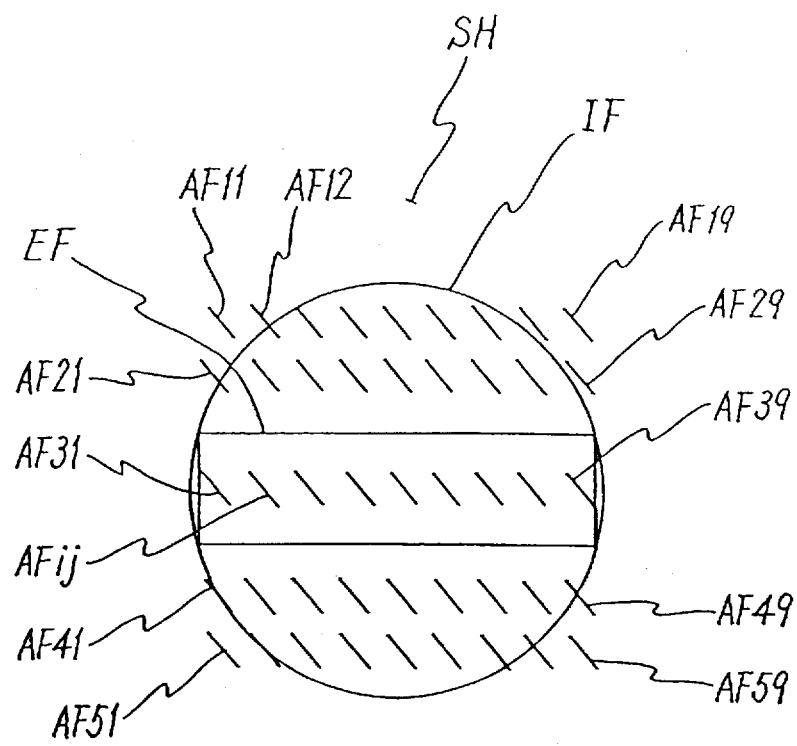
FIG. 5 shows a conceptual illustration for position-measuring points on a wafer W in the case of use of a multiple-point autofocus system of an exposure apparatus in Embodiment 3.
Figure 5:
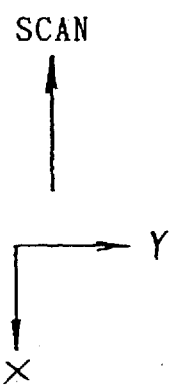

FIG. 5 schematically shows a plan view of a shot area SH on the wafer W illuminated through the diaphragm 28. In the illustration, exposure is made with the pattern on the reticle R in a rectangular exposure area EF which is inscribed in a circular illumination field IF of the projection optical system PL and extends in a direction (Y direction) perpendicular to a scanning direction. The shot area SH on the wafer W is scanned in the scanning direction (X direction) with respect to the exposure area EF. The image of the five arrays of slit pattern on the diaphragm 28 described above is projected by the multiple-point autofocus system onto position-measuring points AF11–19 of the first array located on an upper part and aligned in the Y direction in the illustration, position-measuring points AF21–29 of the second array, position-measuring points AF31–39 of the third array in the exposure area EF, position-measuring points AF41–49 of the fourth array, and position-measuring points AF51–59 of the fifth array respectively. The light-receiving unit 46 is installed with light-receiving elements of five arrays x nine individuals (not shown) corresponding to the diaphragm 28 having the five slit arrays described above. Slit pattern images projected onto the position-measuring points described above are reconstructed on these light-receiving elements. Signals detected by each of the light-receiving elements are subjected to synchronous detection by a selector circuit 52 and PSD 54 in the same manner as Embodiment 1 to generate 45 focus signals corresponding to focus positions of each of the position-measuring points AF11 to AF59 on the shot area SH. Some of focus signals among the 45 focus signals can be used to calculate an inclination angle of the wafer exposure surface and an average focus position. Points for measuring the focus position can be appropriately selected from the position-measuring points in FIG. 5 in accordance with the scanning direction of the wafer W. For example, as shown in FIG. 5, when the wafer W is scanned in the –X direction with respect to the exposure area EF, the focus position can be detected by irradiating only the position-measuring points AF31–39 and AF41–49 in the third and fourth arrays with the light spot. On the other hand, when the wafer W is scanned in the X direction with respect to the exposure area EF, the focus position can be detected by irradiating only the position-measuring points AF21–29 and AF31–39 in the second and third arrays with the light spot. In this procedure, only position-measuring points having even numbers or odd numbers may be irradiated with the light spot. The inclination angle of the exposure surface on the wafer W (shot area SH) can be calculated while dividing it into inclination angles in scanning and non-scanning directions from information on the focus position at the plurality of position-measuring points respectively. Reference may be made to Japanese Patent Laid-open No. 6-283403 (U.S. patent application Set. No. 172098) for details of a calculation method.

Next, the exposure operation of the slit scan system in the exposure apparatus 90 will be briefly explained. At first, the reticle R and the wafer W are positioned at exposure start positions (positions to start stage run-up) by the reticle stage RST and the XY-stage respectively. At the exposure start position, the first shot is separated from the exposure area EF by a predetermined spacing distance. The spacing is provided as a run-up distance until the wafer W is moved at an equal speed (constant speed) by the XY-stage. Subsequently the both stages start movement (run-up) in synchronization. After an equal movement speed is achieved by both of them, the shot area enters the exposure area, and exposure is started. During the exposure, the pattern on the reticle R illuminated within the illumination area is successively transferred by the projection optical system PL onto the shot area located within the exposure area. One scanning for the pattern on the reticle R with respect to the illumination area allows the entire pattern on the reticle R to be transferred (exposed) onto one shot area. Upon completion of one scanning exposure, the XY-stage 16 moves the wafer W to the next shot area SH in accordance with the stepping operation in the same manner as the exposure apparatus 10 of the step-and-repeat system. After the wafer W is positioned at an exposure start position for the next shot area SH, the reticle stage RST starts movement (run-up) in a direction opposite to the direction in the previous scanning, in synchronization with which the XY-stage 16 also starts movement (run-up) in a direction opposite to that of the reticle stage RST. After the both stages arrive at an equal speed as described above, the scanning exposure is executed. In such a manner, the reticle stage RST makes exposure for two shot areas on the wafer W by performing one time of reciprocating movement.

During the execution of the exposure of the slit scan system described above, the focus position is continuously measured for the wafer W at the position-measuring points shown in FIG. 5 by using the plurality of slit-shaped spots. For example, when the scanning direction for the wafer W is the –X direction, the focus position and the inclination angle of a leading edge of the shot area SH are measured at the position-measuring points AF41–49 before the leading edge arrives at the exposure area EF (pre-reading). Measurement results for the focus position at each of the position-measuring points are successively outputted from PSD 54 in accordance with the movement of the XY-stage (positional change in the scanning direction of the wafer W), and they are stored in a memory in the main control unit 56 as a two-dimensional map constituted by position-measuring point coordinates in the scanning directions (X and –X directions) and position-measuring point coordinates in the non-scanning directions (Y and –Y directions) of the XY-stage. The measurement results thus stored are used to calculate the wafer focus position and the inclination angle upon exposure. Next, when the leading edge of the shot area, for which the focus position has been measured, arrives at the exposure area EF, the leveling stage 14 is driven on the basis of the focus position and the inclination angle calculated as described above. Namely, in the slit scan type projection exposure apparatus 90, the focus position and the inclination angle are measured during the scanning exposure at the position-measuring points located just before the exposure area EF (pre-reading), and the leveling stage 14 is driven with a movement amount in the direction of the optical axis and a leveling amount for the wafer W calculated on the basis of the measured focus position and the measured inclination angle when a site on the shot subjected to the measurement enters the exposure area EF.

Further, it is possible to confirm whether or not the wafer W is adjusted at a preferred focus position and a preferred inclination angle on the basis of the calculation results described above when the shot area exists in the exposure area EF according to the actually measured results of the focus position and the inclination angle from the position-measuring points AF31–39 in the third array. If the focus position and the inclination angle are not within predetermined ranges, it is also possible to adjust the operation of the leveling stage 14 again so that the focusing and the leveling are corrected on the basis of the measurement results from the position-measuring points AF31–39 in the third array.

The technique, in which the focus position is continuously measured on a plurality of position-measuring points on a wafer W including an exposure area during scanning exposure in the slit scan system, and focusing and leveling adjustment are performed by using a leveling stage or the like as described above, has been already disclosed by the applicant in Japanese Patent Laid-open No. 6-283403, which is incorporated herein by reference.

Figure 6:
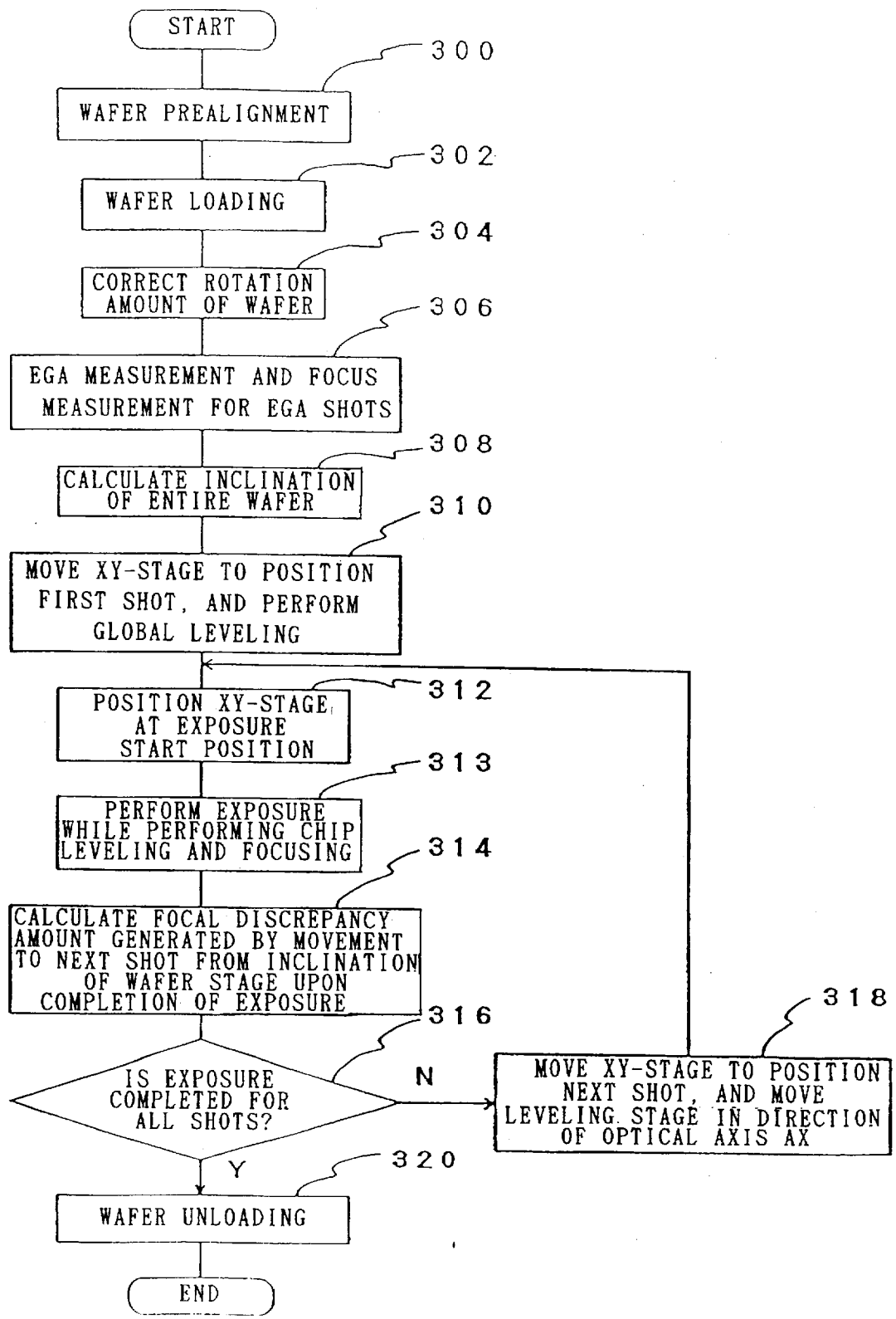
FIG. 6 shows a flow chart illustrating a principal control algorithm for MCU for the slit scan type exposure apparatus in FIG. 4.

Next, an exposure method of the slit scan system by using the exposure apparatus 90 of this Embodiment will be explained with reference to a flow chart in FIG. 6 illustrating a principle control algorithm for MCU 56. This flow chart starts when an instruction command to start exposure is inputted into MCU 56 from an operation unit (not shown) in the same manner as Embodiments 1 and 2. Also in this Embodiment, steps 300–310 until positioning for a first shot are the same as the steps 100–110 in Embodiment 1 (FIG. 2), explanation of which is omitted.

In a step 312, the first shot is positioned at the exposure start position by the XY-stage 16.

In the next step 313, the synchronous movement of the XY-stage 16 and the reticle stage RST is started, and the leveling and the focusing are performed while exposing the shot area in the exposure area with the pattern on the reticle R located in the illumination area. Specifically, as described above, when the scanning direction for the wafer W is the −X direction, the focus position and the inclination angle are previously measured at the position-measuring points AF41–49 in the fourth array located just before the exposure area EF and the position-measuring points AF31–39 in the third array. The focusing and the leveling are executed by using the leveling stage 14 on the basis of the measured focus position and the measured inclination angle when a site on the shot subjected to the measurement at the position-measuring points AF41–49 enters the exposure area EF. This operation is performed until scanning for one shot area is completed. Thus each of the points on the surface of the first shot accurately coincides with the image formation plane of the projection optical system PL. Namely, the exposure is executed in a state in which the surface of the first shot is set within a depth of focus of the projection optical system PL over its entire surface.

In the next step 314, the focal discrepancy amount generated upon movement to the next shot is calculated on the basis of an inclination amount of the leveling stage 14 upon completion of the exposure, and it is stored in an internal memory (not shown). In this procedure, the inclination amount of the leveling stage 14 upon completion of the exposure may be represented by an inclination amount of the leveling stage 14 upon completion of the exposure based on the measurement results by the multiple-point autofocus system. Alternatively, an actual inclination amount (angle) of the leveling stage 14 obtained from a movement amount of an actuator or the like (not shown) for driving the leveling stage 14 may be used.

Next, the routine proceeds to a step 316 to judge whether or not exposure is completed for all shots to be exposed. If this judgment is negated, the routine proceeds to a step 318. In order to position the next shot area at the exposure start position, MCU 56 outputs a control signal to XY-DRV 74 to start movement of the XY-stage 16 so that the XY-stage 16 is driven in an amount corresponding to the position determined in the step 306. During this procedure, a control signal is outputted to Z-DRV 59 so that the leveling stage 14 is driven in the direction of the optical axis AX by the focal discrepancy amount stored in the internal memory in the step 314 described above. Thus coarse focusing is performed until the positioning for the next shot at the exposure start position is completed.

After that, the routine returns to the step 312, followed by repetition of a loop comprising the steps 312→313→314→316→318→312. During this process, exposure is completed for all shots. If the judgment in the step 316 is affirmed, the routine proceeds to a step 320. The wafer is unloaded, and then the processing by this control routine ends.

According to the scanning type exposure method of Embodiment 3 explained above, the chip leveling is performed in the step 314 after the inclination of the entire wafer W is adjusted in the step 310 (global leveling). Thus it is sufficient to slightly correct the inclination upon the chip leveling. In addition, the coarse focusing is performed in the step 318 during movement to the next shot. Thus a focused state can be obtained with no movement at all or with movement of the leveling stage 14 in an extremely minute amount in the direction of the optical axis AX when the next shot is actually positioned at the exposure position. Therefore, an effect is obtained that the throughput scarcely lowers despite the fact that the leveling and the focusing operations are performed for each shot area.

In the slit scan type exposure apparatus described above, there is a possibility that the position in the direction of the optical axis of the reticle R varies, and consequently the position in the direction of the optical axis of the image plane of the reticle pattern R obtained through the projection optical system PL varies because the reticle stage RST moves in the scanning direction for scanning the reticle R. In this Embodiment, in order to overcome this problem, the positional variation amount of the image plane in the direction of the optical axis due to upward or downward movement of the reticle R is previously calculated or measured for each of positions of the reticle stage RST in the scanning direction by moving the reticle stage RST. In this procedure, the positions of the reticle stage RST are converted into positions in the coordinate system of the XY-stage which moves in synchronization therewith, and they are stored in the memory of the main control unit 56 together with coordinate positions obtained by converting positional variation amounts of the image plane in the direction of the optical axis. Thus the positional variation amount of the image plane in the direction of the optical axis stored for each of the positions in the scanning direction can be used in the step 313 to correct the focus positions measured for each of the positions in the scanning direction by the multiple-point autofocus system respectively. In addition, the focal discrepancy amount calculated in the step 314 can be corrected by using the positional variation amount of the image plane in the direction of the optical axis due to upward or downward movement of the reticle R. In the case of processing in the step 314, a value of the positional variation amount of the image plane in the direction of the optical axis corresponding to an end position on a scanning start side is selected from two end positions of the pattern on the reticle R in the scanning direction, and adopted as the positional variation amount of the image plane in the direction of the optical axis. This is because of the following reason. The scanning start position (end) of the pattern on the reticle R changes depending on the scanning direction (X direction, −X direction) for the reticle R because the reticle R is used to make transfer onto two shot areas by means of the reciprocating movement. It is possible to effectively correct the discrepancy in the focal position due to variation of the image plane generated by the movement of the reticle stage RST in the scanning type exposure as described above.

Alternatively, an autofocus (AF) sensor may be placed on the reticle stage to measure the movement of the reticle R in upward and downward directions in real-time. The positional variation of the image plane of the pattern on the reticle R in the direction of the optical axis can be corrected by feedback control in which results of the measurement are fed to the system of the leveling stage 14. Alternatively, a stage for moving the reticle in the Z direction (RZ stage) may be additionally provided on the reticle stage. The positional variation of the image plane of the pattern on the reticle R in the direction of the optical axis may be corrected by moving the RZ stage upwardly or downwardly on the basis of results of the measurement.

Embodiment 2 and its modified embodiments described above can be also applied to the scanning type exposure apparatus and the scanning type exposure method of Embodiment 3.

The explanation has been made in each of Embodiments 1–3 described above on condition that the overlay exposure is performed. However, the present invention can be of course applied as it is when a reticle pattern for a first layer is successively transferred onto a wafer.

As described above, according to the exposure method of the step-and-repeat system and the apparatus therefor of the present invention, the operations for leveling and focusing are partially performed during movement of the photosensitive substrate for positioning the shot area on the photosensitive substrate at the exposure position. The operations for leveling and focusing can be performed at each exposure position in a short period of time. Thus an excellent effect, which has not been obtained in the conventional art, is provided. Namely, the operations for leveling and focusing can be performed at each exposure position at high accuracy without extremely deteriorating the throughput. In addition, according to the exposure method of the slit scan system and the apparatus therefor of the present invention, the operations for leveling and focusing are partially performed during movement of the photosensitive substrate for positioning the shot area on the photosensitive substrate at the exposure start position. The operations for leveling and focusing can be performed at the exposure area during the scanning exposure. Thus an excellent effect, which has not been obtained in the conventional art, is provided. Namely, the operations for leveling and focusing can be performed at each exposure position at high accuracy without extremely deteriorating the throughput. Especially, even when any irregularity (difference in level) is present in the shot area on the photosensitive substrate, the inclination amount of the photosensitive substrate can be accurately determined regardless of the irregularity. An effect is obtained that the improvement in accuracy of global leveling can be expected. In addition, the global leveling is performed in the second step only by adding the focal point detection for the EGA shots as a part of the measuring operation for a plurality of shot areas (EGA shots) which undergo the global alignment, that is so-called enhanced global alignment adopting the statistical technique for determining positions of all shot areas on the photosensitive substrate. Thus an advantage is provided that the leveling is completed in a short period of time at each exposure position.

The present invention may be practiced or embodied in other specific forms without departing from the spirit or essential characteristics thereof. The preferred embodiments described herein are therefore illustrative and not restrictive, the scope of the present invention being indicated by the appended claims and all changes, variations and modifications which come within the meaning of the claims are intended to be embraced therein.

What is claimed is:

1. An exposure method of the step-and-repeat system for successively transferring a mask pattern formed on a mask through a projection optical system onto a plurality of shot areas on a photosensitive substrate respectively, comprising:
   a first step of measuring positions in a direction of an optical axis of the projection optical system at position-measuring points on at least three shot areas;
   a second step of correcting relative inclination between an image plane of the projection optical system and a surface of the photosensitive substrate on the basis of a result of the measurement in the first step during movement of the photosensitive substrate for positioning one shot area of the plurality of shot areas into an image field of the projection optical system;
   a third step of detecting an inclination amount and a focal discrepancy amount of a surface of the one shot area with respect to the image plane of the projection optical system, and inclining the photosensitive substrate and moving the photosensitive substrate in the direction of the optical axis on the basis of a result of the detection;
   a fourth step of transferring the mask pattern onto the one shot area, and determining a positional discrepancy amount from the image plane of the projection optical system for a surface of another shot area which is different from the one shot area and onto which the mask pattern is subsequently transferred on the basis of an inclination amount of the photosensitive substrate inclined in the third step; and
   a fifth step of moving the photosensitive substrate in the direction of the optical axis in an amount corresponding to the determined positional discrepancy amount in the fourth step during movement of the photosensitive substrate for positioning the another shot area into the image field of the projection optical system.

2. The exposure method according to claim 1, wherein:
   the first step further comprises a step of measuring positions of alignment marks affixed to some of the shot areas on the photosensitive substrate respectively, and a step of determining positions of all of the shot areas on the photosensitive substrate by statistically processing a plurality of the measured positions; and
   at least three of the shot areas on which the position-measuring points are set are included in the shot areas for which the positions of the alignment marks are measured.

3. The exposure method according to claim 1, wherein:
   in the first step, the position-measuring points on the photosensitive substrate are set for all of the shot areas onto which the pattern on the mask can be transferred respectively, the position-measuring point in each of the shot areas being set at a position having a relatively small process difference in level; and
   in the fourth step, a positional deviation between the shot areas obtained in the first step is used to determine the positional discrepancy amount of the surface of the another shot area from the image plane of the projection optical system.

4. The exposure method according to claim 3, wherein the inclination amount is calculated for all of the shot areas on the basis of their positions in the direction of the optical axis respectively.

5. The exposure method according to claim 4, wherein the photosensitive substrate is inclined by using the calculated inclination amount when the surface of the shot area is allowed to coincide with the image plane of the projection optical system before transferring the pattern on the mask onto the shot area on the photosensitive substrate.

6. The exposure method according to claim 5, wherein in the third step, the photosensitive substrate is inclined for a shot area to be firstly exposed on the basis of a difference between an inclination amount of the photosensitive substrate corrected in the second step and the calculated inclination amount of the shot area to be firstly exposed, and the photosensitive substrate is inclined for an nth shot area to be exposed in nth exposure (n≧2) on the basis of a difference between an inclination amount of a (n−1)th shot area and the calculated inclination amount of the nth shot area.

7. The exposure method according to claim 3, wherein in the fourth step, the positional discrepancy amount of the surface of the another shot area from the image plane of the projection optical system is determined by using information on the position in the direction of the optical axis measured for the another shot area to be subsequently exposed.

8. The exposure method according to claim 1, wherein in the fourth step, the positional discrepancy amount of the surface of the another shot area from the image plane of the projection optical system is determined by calculation from the inclination amount of the photosensitive substrate inclined in the third step and a distance between centers of the one shot area and the another shot area.

9. An exposure method of the step-and-repeat system for successively transferring a pattern formed on a mask through a projection optical system onto a plurality of shot areas on a photosensitive substrate respectively, comprising:

a first step of measuring positions in a direction of an optical axis of the projection optical system at position-measuring points on all shot areas onto which the pattern on the mask is transferable;

a second step of calculating inclination amounts of the all shot areas on the basis of a result of the measurement in the first step;

a third step of determining an inclination amount and a focal discrepancy amount of a surface of one shot area to be firstly exposed with respect to an image plane of the projection optical system in accordance with the first and second steps, and inclining the photosensitive substrate and moving the photosensitive substrate in the direction of the optical axis on the basis of the determined inclination amount and the determined focal discrepancy amount;

a fourth step of transferring the mask pattern onto the one shot area;

a fifth step of determining a positional discrepancy amount in the direction of the optical axis and a remaining inclination amount of another shot area which undergoes transfer next to the one shot area on the basis of a position in the direction of the optical axis measured in the first step and an inclination amount calculated in the second step of the another shot area and a position in the direction of the optical axis and an inclination amount of the one shot area undergone transfer; and a sixth step of inclining the photosensitive substrate and moving the photosensitive substrate in the direction of the optical axis on the basis of the positional discrepancy amount in the direction of the optical axis and the remaining inclination amount of the another shot area determined in the fifth step during movement of the photosensitive substrate for positioning the another shot area into an image field of the projection optical system.

10. A scanning type exposure method for successively exposing a plurality of shot areas on a photosensitive substrate with a pattern on a mask through a projection optical system, comprising:

scanning the mask with respect to an illumination area on the mask while illuminating the mask, and scanning the photosensitive substrate in synchronization with the scanning for the mask with respect to an exposure area which is conjugate with the illumination area relative to the projection optical system;

said method further comprising:

a first step of measuring positions in a direction of an optical axis of the projection optical system at position-measuring points on at least three shot areas respectively;

a second step of correcting relative inclination between an image plane of the projection optical system and a surface of the photosensitive substrate on the basis of a result of the measurement in the first step during movement of the photosensitive substrate for positioning one shot area of the plurality of shot areas at an exposure start position;

a third step of detecting an inclination amount and a focal discrepancy amount of a surface of the one shot area with respect to the image plane of the projection optical system, and inclining the photosensitive substrate and moving the photosensitive substrate in the direction of the optical axis on the basis of a result of the detection so that the surface of the one shot area in the exposure area is parallel to the image plane of the projection optical system and coincides with a focal position of the projection optical system, while performing scanning exposure for the one shot area on the photosensitive substrate and the mask in synchronization;

a fourth step of determining a positional discrepancy amount from the image plane of the projection optical system for a surface of another shot area, which is different from the one shot area and onto which the mask pattern is subsequently transferred, on the basis of an inclination amount of the photosensitive substrate upon completion of the scanning exposure for the one shot area; and a fifth step of moving the photosensitive substrate in the direction of the optical axis in an amount corresponding to the determined positional discrepancy amount in the fourth step during movement of the photosensitive substrate for positioning the another shot area at the exposure start position.

11. The exposure method according to claim 10, wherein the third step comprises steps of measuring positions on the photosensitive substrate in the direction of the optical axis of the projection optical system at a plurality of points in the exposure area and at a plurality of points in an area in front of the exposure area in a scanning direction of the photosensitive substrate, determining, from results of the measurement, an inclination amount and a focal discrepancy amount of a site in the shot area with the positions having been measured in the area in front of the exposure area with respect to the image plane of the projection optical system, and inclining the photosensitive substrate and moving it in the direction of the optical axis on the basis of the determined inclination amount and the determined focal discrepancy amount of the site so that the surface of the one shot area in the exposure area is parallel to the image plane of the projection optical system, and it coincides with the focal position of the projection optical system when the site enters the exposure area.

12. The exposure method according to claim 10, further comprising steps of determining prior to the third step, a positional variation amount in the direction of the optical axis of the image plane of the projection optical system due to positional variation of the mask in the direction of the optical axis generated during the scanning for the mask, correcting the focal position detected in the third step by using the positional variation amount, and correcting the positional discrepancy amount from the image plane of the projection optical system in the fourth step by using the positional variation amount.

13. A step-and-repeat type exposure apparatus for successively transferring an image of a pattern formed on a mask onto a plurality of shot areas on the photosensitive substrate respectively, comprising:

a projection optical system for projecting the image of the pattern formed on the mask onto the photosensitive substrate;

a movable member for holding the photosensitive substrate, the movable member being movable in a direction of an optical axis of the projection optical system, and able to incline with respect to an image plane of the projection optical system;

a substrate stage for bearing the movable member, the substrate stage being movable two-dimensionally in a plane perpendicular to the optical axis of the projection optical system;

a first detecting sensor for optically detecting positions on a surface of the photosensitive substrate in the direction of the optical axis of the projection optical system;

a second detecting sensor for optically detecting inclination of surfaces of shot areas on the photosensitive substrate with respect to the image plane of the projection optical system;

a first leveling device for inclining the movable member on the basis of positions which are measured in the direction of the optical axis on at least three shot areas by using the first detecting sensor, in order to correct relative inclination between the image plane of the projection optical system and the surface of the photosensitive substrate;

a first controller for controlling the substrate stage for its movement position while monitoring the movement position of the substrate stage so that a plurality of shot areas on the photosensitive substrate are successively exposed with the pattern image of the mask;

a focusing device for driving the movable member on the basis of an output of the first detecting sensor so that a surface of one shot area on the photosensitive substrate having been corrected for inclination coincides with a focal position of the projection optical system;

a second leveling device for driving the movable member on the basis of an output of the second detecting sensor so that the surface of the one shot area is parallel to the image plane of the projection optical system; and a second controller for determining a positional discrepancy amount from the image plane of the projection optical system for a surface of another shot area which is different from the one shot area and onto which the mask pattern is subsequently transferred on the basis of inclination amount of the surface of the one shot area on the photosensitive substrate driven by the second leveling device, and controlling movement of the movable member so that the photosensitive substrate is moved in the direction of the optical axis in an amount corresponding to the positional discrepancy amount during movement of the substrate stage for positioning the another shot area at an exposure position by the first controller.

14. The exposure apparatus according to claim 13, wherein the first detecting sensor is a multiple-point auto-focus system, and the second detecting sensor is a sensor for chip leveling.

15. A scanning type exposure apparatus for successively exposing a plurality of shot areas on a photosensitive substrate, comprising:

a mask stage for scanning a mask with respect to an illumination area on the mask;

a projection optical system for projecting an image of a pattern on the mask onto the photosensitive substrate; and a substrate stage capable of two-dimensional movement for scanning the photosensitive substrate in synchronization with the scanning for the mask with respect to an exposure area which is conjugate with the illumination area relative to the projection optical system;

said apparatus further comprising:

a movable member installed on the substrate stage capable of two-dimensional movement, the movable member being movable in a direction of an optical axis of the projection optical system while holding the photosensitive substrate, and able to incline with respect to an image plane of the projection optical system;

a detecting sensor for optically detecting positions on a surface of the photosensitive substrate in the direction of the optical axis of the projection optical system, and inclination with respect to the image plane of the projection optical system;

a first leveling device for inclining the movable member on the basis of positions which are measured in the direction of the optical axis on at least three shot areas respectively by using the detecting sensor, in order to correct relative inclination between the image plane of the projection optical system and the surface of the photosensitive substrate by;

a first controller for controlling the substrate stage for its movement position while monitoring the movement position of the substrate stage so that a plurality of shot areas on the photosensitive substrate are successively exposed with the pattern image of the mask;

a second leveling device for driving the movable member on the basis of an output of the detecting sensor so that a surface of one shot area existing in the exposure area coincides with a focal position of the projection optical system and is parallel to the image plane of the projection optical system during a period of the scanning for the one shot area on the photosensitive substrate and the mask in synchronization; and a second controller for determining a positional discrepancy amount from the image plane of the projection optical system for a surface of another shot area which is different from the one shot area and onto which the mask pattern is subsequently transferred on the basis of inclination amounts, upon completion of the scanning exposure, of the surfaces of the shot areas on the photosensitive substrate driven by the second leveling device, and controlling movement of the movable member so that the photosensitive substrate is moved in the direction of the optical axis in an amount corresponding to the positional discrepancy amount during movement of the substrate stage for positioning the another shot area at an exposure start position by the first controller.

16. The scanning type exposure apparatus according to claim 15, wherein the detecting sensor is a multiple-point detecting system for optically detecting positions in the direction of the optical axis of the projection optical system and inclination with respect to the image plane of the projection optical system at a plurality of position-measuring points in the exposure area and in areas in front of and at the back of the exposure area in a direction of the scanning for the photosensitive substrate.

17. An exposure method for transferring an image of a mask pattern through a projection optical system onto a plurality of areas on a photosensitive substrate respectively, comprising:

a first step of inclining and moving the substrate on the basis of positional discrepancy amounts of a surface of one area on the substrate with respect to an image plane of the projection optical system at a plurality of points within the one area in the direction of the optical axis of the projection optical system in order to expose the one area on the substrate with the image of the mask pattern;

a second step of moving the substrate in the direction of the optical axis in an amount corresponding to the inclination of the substrate in the first step during movement of the substrate of which the one area has been exposed in a direction perpendicular to the optical axis; and a third step of inclining and moving the substrate on the basis of positional discrepancy amounts of a surface of another area, which is different from the one area, with respect to the image plane of the projection optical system at a plurality of points within the another area in the direction of the optical axis of the projection optical system in order to expose the another area on the substrate with the image of the mask pattern.

* * * * *